US012620431B2

(12) United States Patent
Woo et al.

(10) Patent No.: US 12,620,431 B2
(45) Date of Patent: May 5, 2026

(54) REFRESH MANAGEMENT SELECTION

(71) Applicant: Rambus Inc., San Jose, CA (US)

(72) Inventors: Steven C. Woo, Saratoga, CA (US);
Taeksang Song, San Jose, CA (US)

(73) Assignee: Rambus Inc., San Jose, CA (US)

( * ) Notice: Subject to any disclaimer, the term of this patent is extended or adjusted under 35 U.S.C. 154(b) by 205 days.

(21) Appl. No.: 18/121,246

(22) Filed: Mar. 14, 2023

(65) Prior Publication Data

US 2023/0317136 A1     Oct. 5, 2023

Related U.S. Application Data

(60) Provisional application No. 63/326,431, filed on Apr. 1, 2022.

(51) Int. Cl.
G11C 11/406 (2006.01)

(52) U.S. Cl.
CPC ... G11C 11/40618 (2013.01); G11C 11/40611 (2013.01)

(58) Field of Classification Search
CPC ..................... G11C 11/40618; G11C 11/40611
See application file for complete search history.

(56) References Cited

U.S. PATENT DOCUMENTS

| | | | |
|---|---|---|---|
| 10,885,966 B1 | 1/2021 | Devaux et al. | |
| 11,264,079 B1* | 3/2022 | Roberts | G11C 7/24 |
| 2014/0281206 A1 | 9/2014 | Crawford et al. | |

| | | | |
|---|---|---|---|
| 2016/0180899 A1 | 6/2016 | Kilmer et al. | |
| 2017/0117030 A1 | 4/2017 | Fisch et al. | |
| 2020/0111525 A1* | 4/2020 | Cowles | G11C 11/408 |
| 2022/0189538 A1* | 6/2022 | Kim | G11C 11/408 |
| 2023/0147402 A1* | 5/2023 | Kim | G11C 11/406 |
| | | | 365/222 |
| 2023/0154521 A1* | 5/2023 | Kim | G11C 11/40618 |
| | | | 365/222 |

(Continued)

OTHER PUBLICATIONS

Frigo, Pietro et al., "TRRespass: Exploiting the Many Sides of Target Row Refresh", Security and Privacy Conference, May 2020, Downloaded at: https://download.vusec.net/papers/trrespass_sp20. pdf. 16 pages.

(Continued)

*Primary Examiner* — Min Huang
(74) *Attorney, Agent, or Firm* — The Neudeck Law Firm, LLC

(57) ABSTRACT

Refresh management commands are issued to a memory device in order to cause the refresh of rows in the vicinity of one or more rows being "hammered." These refresh management commands are each associated with respective row addresses that indicates the row(s) to be refreshed in order to mitigate the likelihood of data being corrupted by "row hammer." In an embodiment, the refresh management commands are issued in response to a varying number of activate (ACT) commands having been issued since the last refresh management command. The row selected for a given refresh management command may be selected based on rows that have recently been activated. The selection may be based on "pools" of recently activated rows where these pools are of unequal size. The selection from a given pool may be based on algorithmic and/or random techniques.

20 Claims, 16 Drawing Sheets

(56) References Cited

U.S. PATENT DOCUMENTS

2024/0185904 A1* 6/2024 Kim ..................... G11C 11/406

OTHER PUBLICATIONS

Jattke, Patrick et. al., "BLACKSMITH: Scalable Rowhammering in the Frequency Domain", 2022, https://comsec.ethz.ch/wp-content/files/blacksmith_sp22.pdf. 19 pages.

* cited by examiner

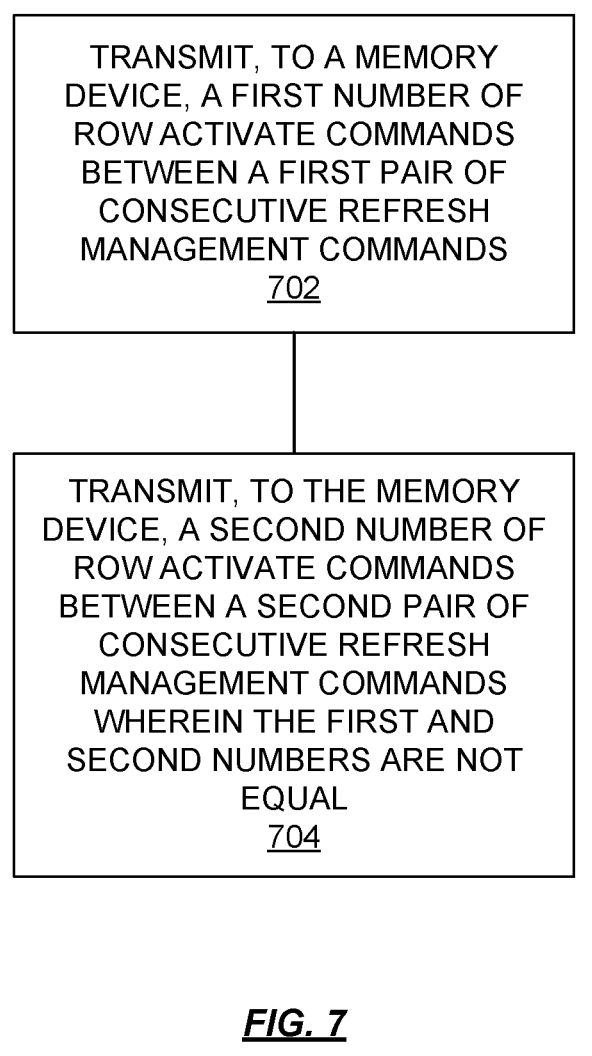

TRANSMIT, TO A MEMORY
DEVICE, A FIRST NUMBER OF
ROW ACTIVATE COMMANDS
BETWEEN A FIRST PAIR OF
CONSECUTIVE REFRESH
MANAGEMENT COMMANDS
702

TRANSMIT, TO THE MEMORY
DEVICE, A SECOND NUMBER OF
ROW ACTIVATE COMMANDS
BETWEEN A SECOND PAIR OF
CONSECUTIVE REFRESH
MANAGEMENT COMMANDS
WHEREIN THE FIRST AND
SECOND NUMBERS ARE NOT
EQUAL
704

*FIG. 7*

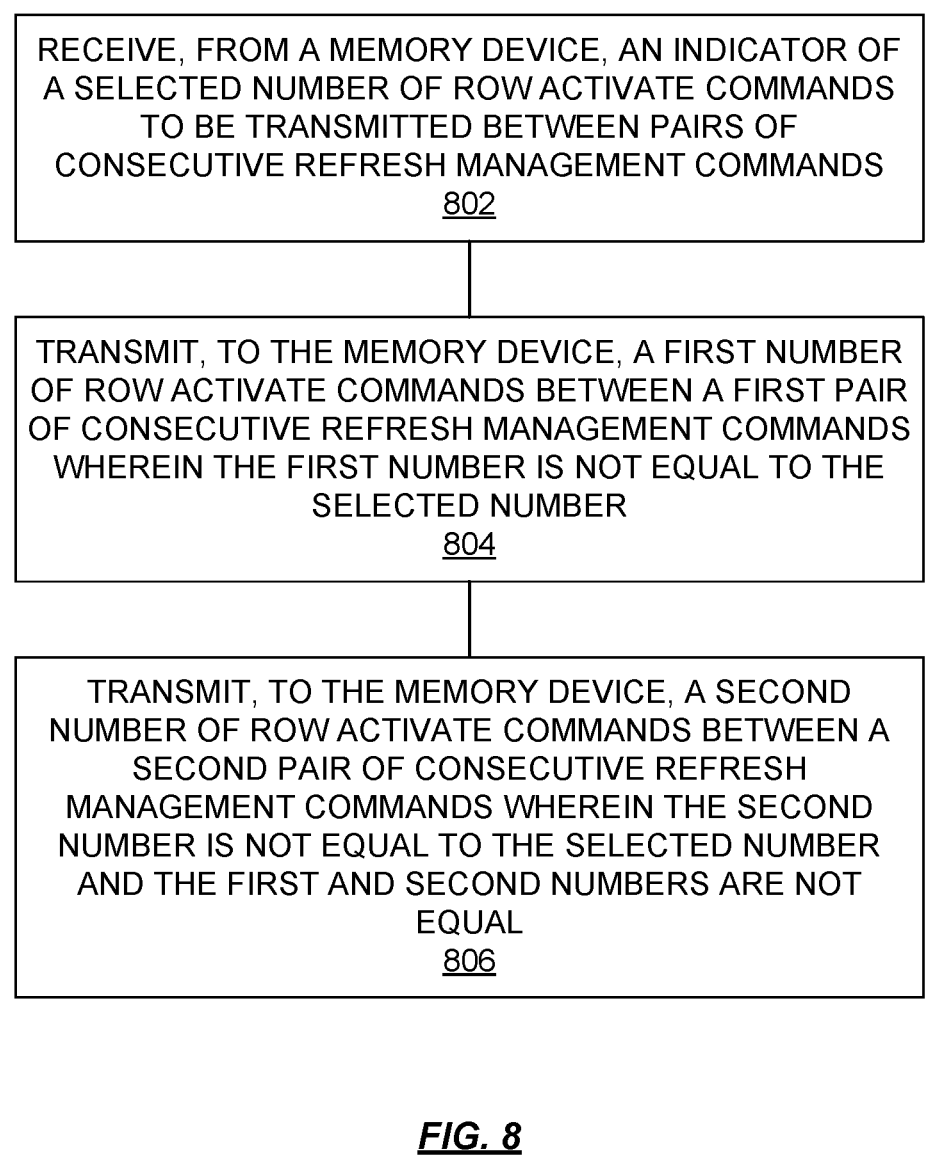

RECEIVE, FROM A MEMORY DEVICE, AN INDICATOR OF A SELECTED NUMBER OF ROW ACTIVATE COMMANDS TO BE TRANSMITTED BETWEEN PAIRS OF CONSECUTIVE REFRESH MANAGEMENT COMMANDS
802

TRANSMIT, TO THE MEMORY DEVICE, A FIRST NUMBER OF ROW ACTIVATE COMMANDS BETWEEN A FIRST PAIR OF CONSECUTIVE REFRESH MANAGEMENT COMMANDS WHEREIN THE FIRST NUMBER IS NOT EQUAL TO THE SELECTED NUMBER
804

TRANSMIT, TO THE MEMORY DEVICE, A SECOND NUMBER OF ROW ACTIVATE COMMANDS BETWEEN A SECOND PAIR OF CONSECUTIVE REFRESH MANAGEMENT COMMANDS WHEREIN THE SECOND NUMBER IS NOT EQUAL TO THE SELECTED NUMBER AND THE FIRST AND SECOND NUMBERS ARE NOT EQUAL
806

*FIG. 8*

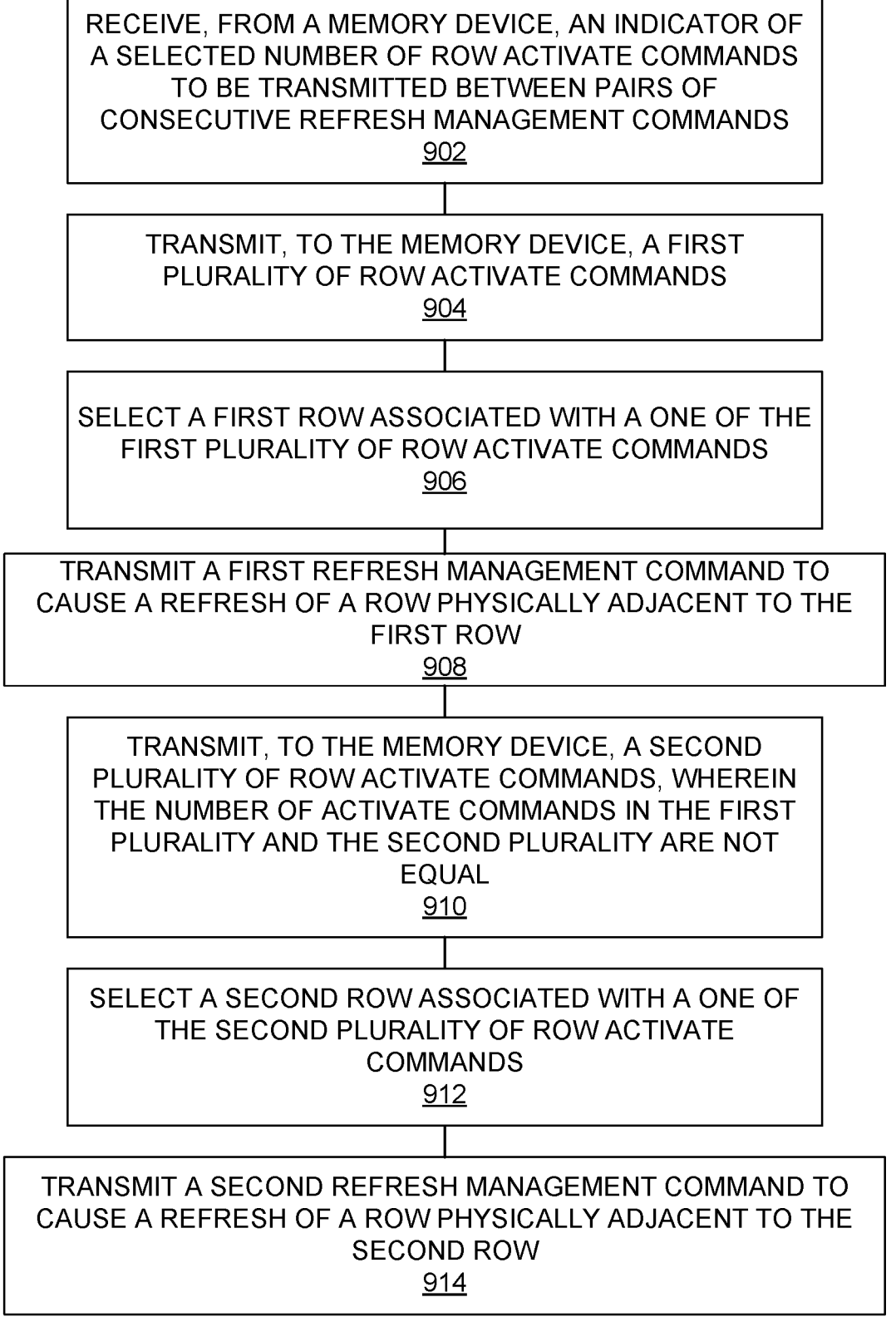

RECEIVE, FROM A MEMORY DEVICE, AN INDICATOR OF A SELECTED NUMBER OF ROW ACTIVATE COMMANDS TO BE TRANSMITTED BETWEEN PAIRS OF CONSECUTIVE REFRESH MANAGEMENT COMMANDS
902

TRANSMIT, TO THE MEMORY DEVICE, A FIRST PLURALITY OF ROW ACTIVATE COMMANDS
904

SELECT A FIRST ROW ASSOCIATED WITH A ONE OF THE FIRST PLURALITY OF ROW ACTIVATE COMMANDS
906

TRANSMIT A FIRST REFRESH MANAGEMENT COMMAND TO CAUSE A REFRESH OF A ROW PHYSICALLY ADJACENT TO THE FIRST ROW
908

TRANSMIT, TO THE MEMORY DEVICE, A SECOND PLURALITY OF ROW ACTIVATE COMMANDS, WHEREIN THE NUMBER OF ACTIVATE COMMANDS IN THE FIRST PLURALITY AND THE SECOND PLURALITY ARE NOT EQUAL
910

SELECT A SECOND ROW ASSOCIATED WITH A ONE OF THE SECOND PLURALITY OF ROW ACTIVATE COMMANDS
912

TRANSMIT A SECOND REFRESH MANAGEMENT COMMAND TO CAUSE A REFRESH OF A ROW PHYSICALLY ADJACENT TO THE SECOND ROW
914

*FIG. 9*

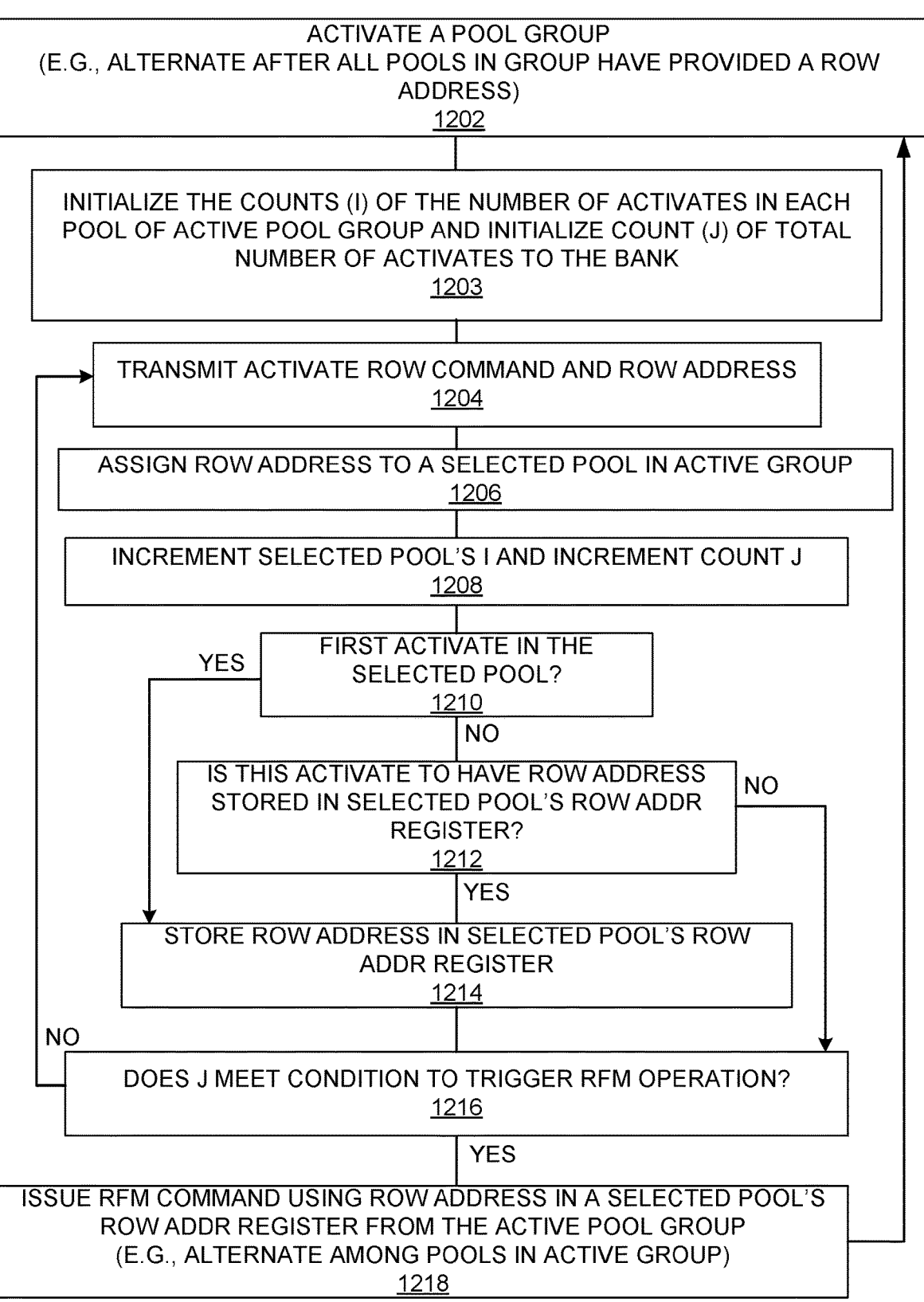

ACTIVATE A POOL GROUP
(E.G., ALTERNATE AFTER ALL POOLS IN GROUP HAVE PROVIDED A ROW ADDRESS)
1202

INITIALIZE THE COUNTS (I) OF THE NUMBER OF ACTIVATES IN EACH POOL OF ACTIVE POOL GROUP AND INITIALIZE COUNT (J) OF TOTAL NUMBER OF ACTIVATES TO THE BANK
1203

TRANSMIT ACTIVATE ROW COMMAND AND ROW ADDRESS
1204

ASSIGN ROW ADDRESS TO A SELECTED POOL IN ACTIVE GROUP
1206

INCREMENT SELECTED POOL'S I AND INCREMENT COUNT J
1208

FIRST ACTIVATE IN THE SELECTED POOL?
1210

YES          NO

IS THIS ACTIVATE TO HAVE ROW ADDRESS STORED IN SELECTED POOL'S ROW ADDR REGISTER?
1212

NO          YES

STORE ROW ADDRESS IN SELECTED POOL'S ROW ADDR REGISTER
1214

NO

DOES J MEET CONDITION TO TRIGGER RFM OPERATION?
1216

YES

ISSUE RFM COMMAND USING ROW ADDRESS IN A SELECTED POOL'S ROW ADDR REGISTER FROM THE ACTIVE POOL GROUP
(E.G., ALTERNATE AMONG POOLS IN ACTIVE GROUP)
1218

*FIG. 12*

REFRESH MANAGEMENT SELECTION

BRIEF DESCRIPTION OF THE DRAWINGS

FIG. 7 is a flowchart illustrating a method of issuing refresh management commands.

FIG. 8 is a flowchart illustrating a method of selecting refresh management command occurrences.

FIG. 9 is flowchart illustrating a method of selecting refresh management command row addresses.

FIG. 12 is a flowchart illustrating a method of issuing refresh management commands and associated rows.

DETAILED DESCRIPTION OF THE EMBODIMENTS

Figure 1:
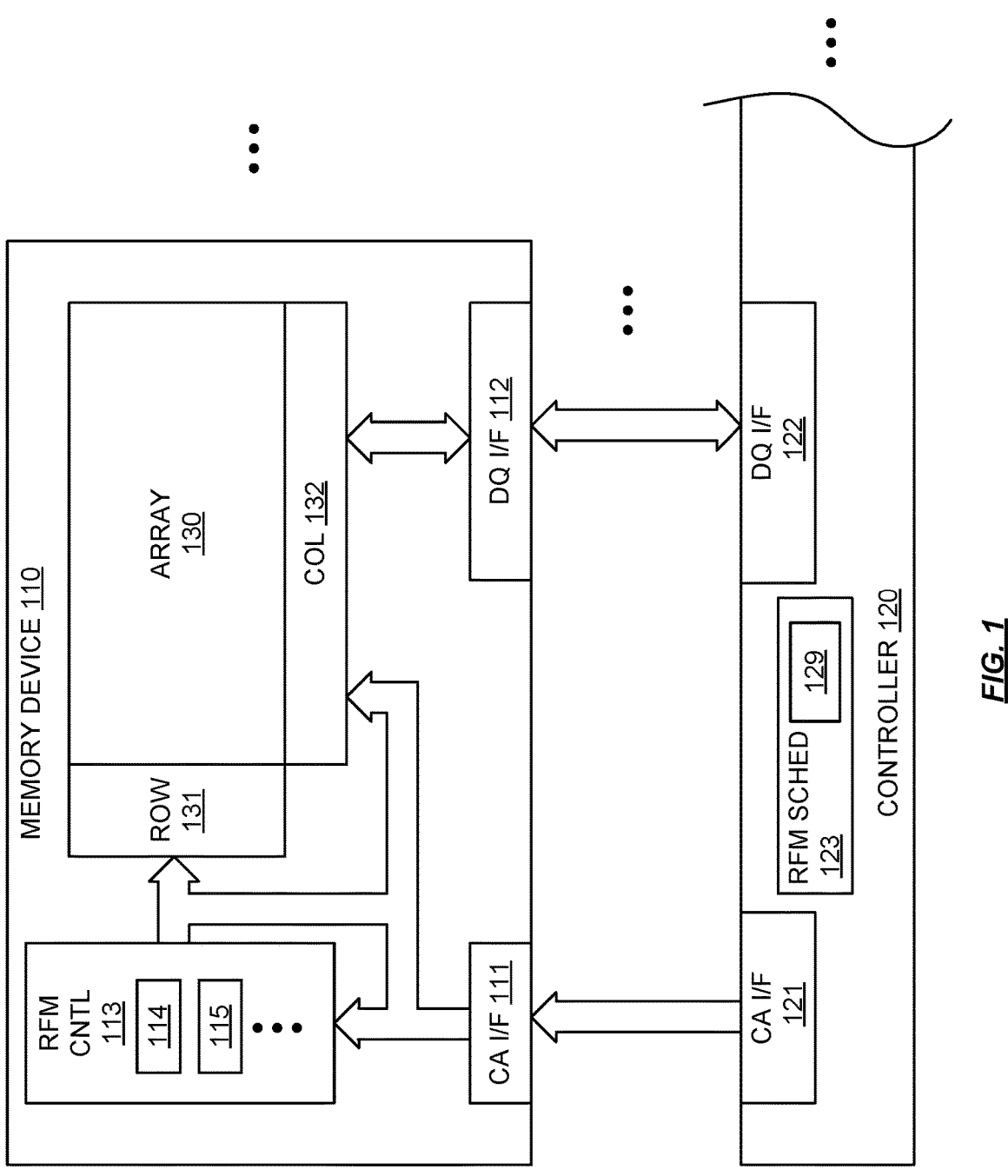
FIG. 1 is a block diagram illustrating a memory system with memory device refresh management selection.

Repeated row activations of the same row in a dynamic random access memory (DRAM) device (whether malicious or accidental) can cause cells in the neighborhood of the repeatedly activated row to lose a stored value. This effect on DRAM storage reliability has been termed "row hammer." Row hammer, when applied to the multiple, parallel, DRAM device accesses that may occur with memory modules, can cause multiple errors across multiple DRAM devices on the module that are possibly uncorrectable and/or undetectable.

In an embodiment, refresh management (RFM) commands are issued to a memory device in order to cause the refresh of rows in the vicinity of one or more rows being "hammered." These refresh management commands are each associated with respective row addresses that indicates the row(s) to be refreshed in order to mitigate the likelihood of data being corrupted by "row hammer." In an embodiment, these associations may be specified as part of the refresh management commands. In other embodiments, these associations may be made by a device (e.g., memory device, or registering clock driver) that receives the activate (ACT) and refresh management commands.

In an embodiment, the refresh management commands are issued in response to a varying number of activate commands having been issued since the last refresh management command. In other words, for example, rather than issuing a refresh management command for every 32 activate commands, the memory system may alternate between issuing a refresh management command after 61 activates and 3 activates. In this example, the average rate of a refresh management command for every 32 activates (i.e., 61+3=64 and 64/2=32) is maintained.

In an embodiment, the row selected for a given refresh management command may be selected based on rows that have recently been activated (e.g., since last one or two RFM commands). The selection may also be based on "pools" of recently activated rows where these pools are of unequal size. The selection from a given pool may be based on algorithmic (e.g., first activate placed in the pool after an RFM command) and/or random techniques (e.g., selecting one activate at random from a pool).

The descriptions and embodiments disclosed herein may be made with references to DRAM devices and DRAM memory arrays. This, however, should be understood to be a first example where, due at least to the widespread adoption of DRAM technology, "row-hammer" has been observed and studied. It should be understood that other memory technologies that may be susceptible to "row-hammer" and therefore may also benefit from the methods and/or apparatus described herein. These memory technologies include, but are not limited to static random access memory (SRAM), non-volatile memory (such as flash), conductive bridging random access memory (CBRAM—a.k.a., programmable metallization cell—PMC), resistive random access memory (a.k.a., RRAM or ReRAM), magnetoresistive random-access memory (MRAM), Spin-Torque Transfer (STT-MRAM), phase change memory (PCM), and the like, and/or combinations thereof. Accordingly, it should be understood that in the disclosures and/or descriptions given herein, these aforementioned technologies may be substituted for, included with, and/or encompassed within, the references to DRAM, DRAM devices, and/or DRAM arrays made herein.

FIG. 1 is a block diagram illustrating a memory system with memory device refresh management selection. In FIG. 1, memory system 100 comprises memory device 110 and memory controller 120. Memory device 110 includes command/address (CA) interface 111, data (DQ) interface 112, refresh management (RFM) control 113, memory array 130, row circuitry 131, and column circuitry 132. Refresh management control 113 includes selected address register 114 and selected address register 115. Controller 120 includes CA interface 121, DQ interface 122, and refresh management scheduler 123. Refresh management scheduler 123 includes configuration information 129.

Controller 120 and memory device 110 may be integrated circuit type devices, such as are commonly referred to as "chips". A memory controller, such as controller 120, manages the flow of data going to and from memory devices and/or memory modules. Memory device 110 may be a standalone device, or may be a component of a memory module such as a DIMM module used in servers. Memory device 110 may be a device that adheres to, or is compatible with, a dynamic random access memory (DRAM) specification. A memory controller can be a separate, standalone chip, or integrated into another chip. For example, a memory controller 120 may be included on a single die with a microprocessor, included as a chip co-packaged with one or more microprocessor chips, included as part of a more complex integrated circuit system such as a block of a system on a chip (SOC), or be remotely coupled to one or more microprocessors via a fabric interconnect or other type of interconnect.

CA interface 121 of controller 120 is operatively coupled to CA interface 111 of memory device 110. CA interface 121 is operatively coupled to CA interface 111 to communicate commands and addresses (e.g., row and column addresses) from controller 120 to memory device 110. In an embodiment, the commands communicated from controller 120 to memory device 110 include activate (ACT) commands with an associated external row address, and refresh management (RFM) commands.

Controller 120 is operatively coupled to memory device 110 via DQ interface 122 and DQ interface 112. Controller 120 and memory device 110 are operatively coupled via DQ interface 122 and DQ interface 112 to bidirectionally communicate data. Memory device 110 may store (e.g., in memory array 130) and retrieve (e.g., from memory array 130) data communicated via DQ interface 122 and DQ interface 112.

CA interface 111 of memory device 110 is operatively coupled to memory array 130. Row addresses received via CA interface 111 (a.k.a., external row addresses) in association with activate commands are operatively coupled to memory array 130 via row circuitry 131 (e.g., row address decoders, buffers, etc.) One or more row addresses received via CA interface 111 in association with activate commands may be provided to refresh management control 113. As described herein, the one or more row addresses provided to refresh management control 113 may be stored in selected address register 114 and/or selected address register 115. Column addresses received via CA interface 111 are operatively coupled to memory array 130 via column circuitry 132 (e.g., column address decoders, buffers, etc.).

Refresh management scheduler 123 of controller 120 determines when and how often (e.g., number of intervening ACT commands between RFM commands) to transmit refresh management commands to memory device 110 via CA interface 121 and CA interface 111. For example, based on configuration information 129 (e.g., one or more of information received from memory device 110, a mode indicator, operating mode, programmed register value, programmed fuses, etc.), refresh management scheduler 123 issues refresh management commands to memory device 110. In an embodiment, controller 120 transmits refresh management commands to memory device 110 using varying numbers of activate commands between consecutive pairs of refresh management commands.

In some embodiments, controller 120 may alternate between two numbers of intervening activate commands between consecutive refresh management commands. For example, based on configuration information 129, controller 120 may transmit a first refresh management command, wait for N number (and/or approximately N number) of activate commands to be transmitted, issue a second refresh management command, wait for M number (and/or approximately M number) of activate commands to be transmitted (where N≠M), then issue a third refresh management command, again wait for N number (and/or approximately N number) of activate commands to be transmitted, issue a fourth refresh management command, and so forth. In some embodiments, based on configuration information 129, controller 120 may rotate between more than two numbers of intervening activate commands between consecutive refresh management commands. For example, controller 120 may rotate among transmitting N, M, and P numbers (and/or approximately N, M, and/or P numbers) of activate commands, where N≠M≠P.

In an embodiment, refresh management operations are initiated by memory device 130 in response to receiving an RFM command from controller 120. In an embodiment, refresh management operations may also be initiated in response to a "regular" refresh command received from controller 120 that refresh management control 113 "converts" to a refresh management operation.

In an embodiment, in response to initiating a refresh management command operation (e.g., in response to receiving an RFM command or a "regular" refresh command that is converted to an RFM operation), refresh management control 113 of memory device 110 selects at least one row to refresh. In an embodiment, refresh management control 113 algorithmically selects a row to be refreshed based on a row associated with (e.g., specified by) a selected previous activate command. For example, refresh management control 113 may select a row that is physically adjacent to (or in the vicinity of) the row that was activated by the $R^{th}$ activate command after the last refresh management command. For example, refresh management control 113 may select a row that is physically adjacent to (or in the vicinity of) the first (i.e., R=1) row that was activated after the last refresh management command. The address of this row (or address from the ACT command) may be stored in selected address register 114 and/or selected address register 115. In another example, refresh management control 113 may select a row that is physically adjacent to (or in the vicinity of) a row activated by a median or near-middle (e.g., R≈N/2 or R≈M/2 for N and M numbers of activates between RFM commands, respectively, as appropriate, for the number of intervening activate commands between the last and current refresh management commands, etc.) or near last (e.g., R≈N, N−1, etc., R≈M, M−1, etc., as appropriate) activate command in the sequence of activate commands between RFM commands. In some embodiments, one or more other algorithmic techniques may be employed (e.g., linear feedback shift register, histogram, etc.) to select the activate command that determines the address of a row to be refreshed by a given RFM command.

In an embodiment, refresh management control 113 randomly selects, or uses a randomized selection technique (e.g., pseudo-random number generator) to select the activate command that determines the address of a row to be refreshed. For example, refresh management control 113 may select a row that is physically adjacent to (or in the vicinity of) a row that was activated by a randomly selected previous activate command. In an embodiment, the randomly selected activate command may be selected from a pool of previous activate commands. The row address associated with the selected activate command (or a row adjacent to and/or in the vicinity of) may be stored in selected address register 114 and/or selected address register 115. In an embodiment, the pool of previous activate commands comprises or is composed of the immediately preceding activate commands since the last RFM command. In an embodiment, the pool of previous activate commands comprises or is composed of preceding activate commands transmitted in between a pair of RFM commands that does not include the next RFM command. In an embodiment, the sizes of the selection pools vary with the numbers of intervening activate commands between RFM commands (e.g., N and M). In an embodiment, the sizes of the selection pools (e.g., N and M) vary but the numbers of intervening activate commands between RFM commands remains the same (e.g., 32 intervening activates between each RFM command).

In an embodiment, memory controller 120 transmits, via CA interface 121 row activate (ACT) commands and refresh management (RFM) commands to a memory device 110. Memory device 110 receives these ACT and RFM commands via CA interface 111. Refresh management scheduler 123, based on configuration information 129, determines a first number (N) of row activate commands to be transmitted between a first refresh management command and a second refresh management command. For example, based on configuration information 129, refresh management scheduler 123 may configure controller 120 to transmit a first RFM command, followed by N number of ACT commands each associated with a respective row address. After the N number of ACT commands are transmitted, controller 120 is configured to transmit a second RFM command. Refresh management scheduler 123 also, based on configuration information 129, determines a second number (M) of row activate commands to be transmitted between the second refresh management command and a third refresh management command. For example, based on configuration information 129, refresh management scheduler 123 may configure controller 120 to transmit the second RFM command, followed by M number of ACT commands each associated with a respective row address. After the M number of ACT commands are transmitted, controller 120 is configured to transmit a third RFM command. Controller 120 may be configured to, after transmitting the third RFM command, transmit another N number of ACT commands, followed by an RFM command, then followed by M number of ACT commands, followed by another RFM command, and so on, alternating between sets of N and M ACT commands between RFM commands.

In an embodiment, memory controller 120 receives, from the memory device 110, an indicator associated with an average number of ACT commands to be transmitted between successive RFM commands. Thus, one of N and M may be greater than the average number of ACT commands to be transmitted between successive RFM commands and the other of N and M may be less than the average. In an embodiment, the average of N and M may be less than, equal to, or greater than the average number of ACT commands to be transmitted between successive RFM commands.

In an embodiment, memory device 110 (and refresh management control 113, in particular) selects a first row address from the N number of row addresses received in association with the ACT commands received by memory device 110 between the first RFM command and the second RFM command. In response to the second RFM command, and based on the first row address (e.g., stored in selected address register 114), memory device 110 selects at least a second row address to be refreshed (e.g., a row that is physically adjacent to, or in the vicinity of, the row addressed by the first row address).

Memory device 110 (and refresh management control 113, in particular) may also select a third row address from the M number of row addresses received in association with the ACT commands received by memory device 110 between the second RFM command and the third RFM command. In an embodiment, N is not equal to M. In response to the third RFM command, and based on the second row address (e.g., stored in selected address register 115), memory device 110 selects at least a fourth row address to be refreshed (e.g., a row that is physically adjacent to, or in the vicinity of, the row addressed by the third row address).

In an embodiment, memory controller 120 is configured to transmit, via CA interface 121, N number of row activate (ACT) commands between a first pair of consecutive refresh management commands. Memory controller 120 is also configured to transmit, via CA interface 121, M number of ACT commands between a second pair of consecutive refresh management commands, where N and M are positive integers that are not equal.

In some embodiments, memory controller 120 may also transmit, via CA interface 121, P number of row activate (ACT) commands between a third pair of consecutive refresh management commands where P is a positive integer that is not equal to N and is not equal to M.

In some embodiments, memory device 110 selects a first row address from the N number of row addresses associated with the ACT commands received by memory device 110 between the first pair of consecutive refresh management commands. In response to an RFM command (which may or may not be the second RFM command of the first pair), and based on the first row address, memory device 110 (and refresh management control 113, in particular) selects at least a second row address to be refreshed (e.g., one or more rows adjacent to or in the vicinity of the row addressed by the first row address). In an embodiment, memory device 110 may use a randomized selection technique to select the first row address from the N number of row addresses.

Memory device 110 may also use the randomized selection technique to select a third row address from the M number of row addresses received by memory device 110 between the second pair of RFM commands. In some embodiments, the first pair of consecutive refresh management command and the second pair of consecutive refresh management commands may have a common refresh management command (i.e., memory controller 120 is transmitting alternating sets of N and M numbers of ACT commands between RFM commands.)

Figure 2:
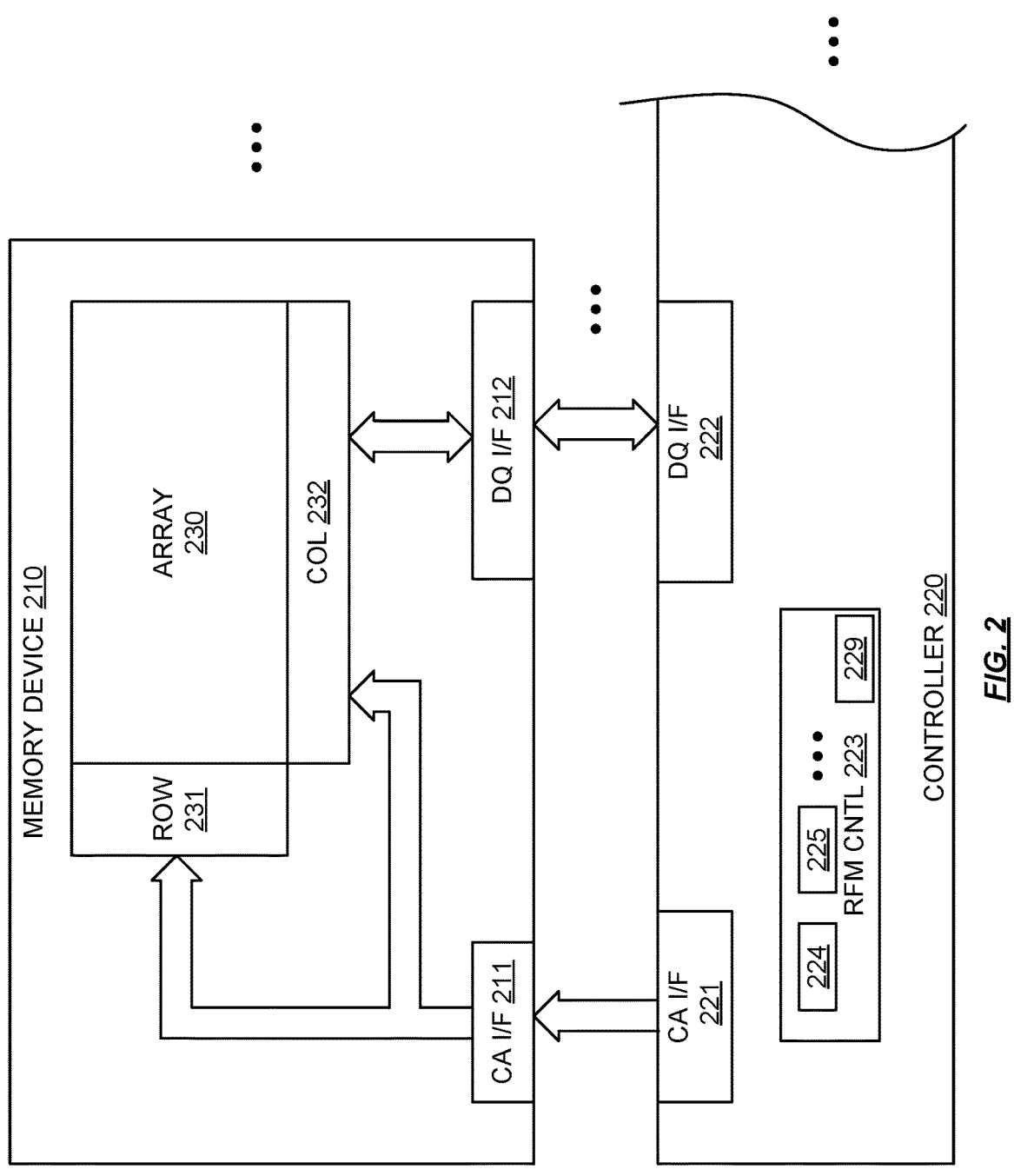
FIG. 2 is a block diagram illustrating a memory system with memory controller refresh management selection.

FIG. 2 is a block diagram illustrating a memory system with memory controller refresh management selection. In FIG. 2, memory system 200 comprises memory device 210 and memory controller 220. Memory device 210 includes command/address (CA) interface 211, data (DQ) interface 212, memory array 230, row circuitry 231, and column circuitry 232. Controller 220 includes CA interface 221, DQ interface 222, and refresh management control 223. Refresh management control 223 includes configuration information 229, and selected address registers 224-225.

CA interface 221 of controller 220 is operatively coupled to CA interface 211 of memory device 210. CA interface 221 is operatively coupled to CA interface 211 to communicate commands and addresses (e.g., row and column addresses) from controller 220 to memory device 210. In an embodiment, the commands communicated from controller 220 to memory device 210 include activate (ACT) commands with an associated external row address, and refresh management (RFM) commands with an associated external row address.

Controller 220 is operatively coupled to memory device 210 via DQ interface 222 and DQ interface 212. Controller 220 and memory device 210 are operatively coupled via DQ interface 222 and DQ interface 212 to bidirectionally communicate data. Memory device 210 may store (e.g., in memory array 230) and retrieve (e.g., from memory array 230) data communicated via DQ interface 222 and DQ interface 212.

CA interface 211 of memory device 210 is operatively coupled to memory array 230. Row addresses received via CA interface 211 (a.k.a., external row addresses) in association with activate (ACT) commands are operatively coupled to memory array 230 via row circuitry 231 (e.g., row address decoders, buffers, etc.) Similarly, row addresses received via CA interface 211 (a.k.a., external row addresses) in association with refresh management (RFM) commands are operatively coupled to memory array 230 via row circuitry 231 (e.g., row address decoders, buffers, etc.) As described herein, the one or more row addresses provided in association with RFM command(s) may be stored in selected address register 224 and/or selected address register 225. Column addresses received via CA interface 211 are operatively coupled to memory array 230 via column circuitry 232 (e.g., column address decoders, buffers, etc.).

Refresh management control 223 of controller 220 determines when and how often (e.g., number of intervening ACT commands between RFM commands) to transmit refresh management commands to memory device 210 via CA interface 221 and CA interface 211. For example, based on configuration information 229 (e.g., one or more of information received from memory device 210, a mode indicator, an operating mode, programmed register value, programmed fuses, etc.), refresh management control 223 issues refresh management commands to memory device 210. In an embodiment, controller 220 transmits refresh management commands and associated row addresses to memory device 210 using varying numbers of activate commands between consecutive pairs of refresh management commands.

In some embodiments, controller 220 may alternate between two numbers of intervening activate commands between consecutive refresh management commands. For example, based on configuration information 229, controller 220 may transmit a first refresh management command, wait for N number (and/or approximately N number) of activate commands to be transmitted, issue a second refresh management command, wait for M number (and/or approximately M number) of activate commands to be transmitted (where N≠M), then issue a third refresh management command, again wait for N number (and/or approximately N number) of activate commands to be transmitted, issue a fourth refresh management command, and so forth. In some embodiments, based on configuration information 229, controller 220 may rotate between more than two numbers of intervening activate commands between consecutive refresh management commands. For example, controller 220 may rotate among transmitting N, M, and P numbers (and/or approximately N, M, and/or P numbers) of activate commands, where N≠M≠P.

When refresh management control 223 is to transmit a refresh management command (e.g., in response to a threshold number of ACT commands having been sent since the last RFM command), refresh management control 223 of controller 220 selects at least one row address to send in association with the RFM command. In an embodiment, refresh management control 223 algorithmically selects a row to be refreshed based on a row transmitted with (e.g., specified by) a selected previously transmitted activate command. For example, refresh management control 223 may select a row that is physically adjacent to, and/or numerically in consecutive sequence to (or in the physical or numerical vicinity of) the row address that was transmitted with the $R^{th}$ activate command after the last refresh management command was transmitted. For example, refresh management control 223 may select a row address that is physically adjacent to, and/or numerically in consecutive sequence to (or in the physical or numerical vicinity of) the first (i.e., R=1) row address that was transmitted after the last refresh management command was transmitted. The address of this row (or address transmitted with the ACT command) may be stored in selected address register 224 and/or selected address register 225. In another example, refresh management control 223 may select a row that is physically adjacent to, and/or numerically in consecutive sequence to (or in the physical or numerical vicinity of) a row address activated by a median or near-middle (e.g., R≈N/2 or R≈M/2 for N and M numbers of activates between RFM commands, respectively, as appropriate, for the number of intervening activate commands between the last and current refresh management commands, etc.) or near last (e.g., R≈N, N−1, etc., R≈M, M−1, etc., as appropriate) activate command in the sequence of activate commands between RFM commands. In some embodiments, one or more other algorithmic techniques may be employed (e.g., linear feedback shift register, histogram, etc.) to select the activate command that determines the address of a row to be refreshed by a given RFM command.

In an embodiment, refresh management control 223 randomly selects, or uses a randomized selection technique (e.g., pseudo-random number generator) to select the activate command that determines the address of a row to be refreshed. For example, refresh management control 223 may select a row address that is physically adjacent to, and/or numerically in consecutive sequence to (or in the physical or numerical vicinity of) a row that was activated by a randomly selected previously transmitted activate command. In an embodiment, the randomly selected activate command may be selected from a pool of previously transmitted activate commands. The row address associated with the selected activate command (or a row address physically adjacent to, numerically in sequence with, and/or in the vicinity of) may be stored in selected address register 224 and/or selected address register 225. In an embodiment, the pool of previously transmitted activate commands comprises or is composed of the activate commands transmitted immediately preceding the last RFM command. In an embodiment, the pool of previously transmitted activate commands comprises or is composed of preceding activate commands transmitted in between a pair of RFM commands that does not include the next RFM command. In an embodiment, the sizes of the selection pools vary with the numbers of intervening activate commands between RFM commands (e.g., N and M). In an embodiment, the sizes of the selection pools (e.g., N and M) vary but the numbers of intervening activate commands between RFM commands remains the same (e.g., 32 intervening activates between each RFM command).

In an embodiment, memory controller 220 transmits, via CA interface 221 row activate (ACT) commands and refresh management (RFM) commands to a memory device 210. Memory device 210 receives these ACT and RFM commands via CA interface 211. Refresh management control 223, based on configuration information 229, determines a first number (N) of row activate commands to be transmitted between a first refresh management command and a second refresh management command. For example, based on configuration information 229, refresh management control 223 may configure controller 220 to transmit a first RFM command, followed by N number of ACT commands each associated with a respective row address. After the N number of ACT commands are transmitted, controller 220 is configured to transmit a second RFM command. Refresh management control 223 also, based on configuration information 229, determines a second number (M) of row activate commands to be transmitted between the second refresh management command and a third refresh management command. For example, based on configuration information 229, refresh management control 223 may configure controller 220 to transmit the second RFM command, followed by M number of ACT commands each associated with a respective row address. After the M number of ACT commands are transmitted, controller 220 is configured to transmit a third RFM command. Controller 220 may be configured to, after transmitting the third RFM command, transmit another N number of ACT commands, followed by an RFM command, then followed by M number of ACT commands, followed by another RFM command, and so on, alternating between sets of N and M ACT commands between RFM commands.

In an embodiment, memory controller 220 receives, from the memory device 210, an indicator associated with an average number of ACT commands to be transmitted between successive RFM commands. Thus, one of N and M may be greater than the average number of ACT commands to be transmitted between successive RFM commands and the other of N and M may be less than the average. In an embodiment, the average of N and M may be less than, equal to, or greater than the average number of ACT commands to be transmitted between successive RFM commands.

In an embodiment, memory controller 220 (and refresh management control 223, in particular) selects a first row address from the N number of row addresses transmitted in association with the ACT commands transmitted by memory controller 220 between the first RFM command and the second RFM command. When the conditions for transmitting a second RFM command are met, and based on the first row address (e.g., stored in selected address register 224), memory controller 220 selects at least a second row address to be refreshed (e.g., a row that is physically and/or numerically adjacent or in the vicinity of, the row addressed by the first row address).

Memory controller 220 (and refresh management control 2213, in particular) may also select a third row address from the M number of row addresses transmitted in association with the ACT commands transmitted by memory controller 220 between the second RFM command and the third RFM command. In an embodiment, N is not equal to M. When the conditions to transmit the third RFM command are met, and based on the second row address (e.g., stored in selected address register 225), memory controller 220 selects at least a fourth row address to be refreshed (e.g., a row that is physically and/or numerically adjacent or in the vicinity of, the row addressed by the third row address).

In an embodiment, memory controller 220 is configured to transmit, via CA interface 221, N number of row activate (ACT) commands between a first pair of consecutive refresh management commands. Memory controller 220 is also configured to transmit, via CA interface 221, M number of ACT commands between a second pair of consecutive refresh management commands, where N and M are positive integers that are not equal.

In some embodiments, memory controller 220 may also transmit, via CA interface 221, P number of row activate (ACT) commands between a third pair of consecutive refresh management commands where P is a positive integer that is not equal to N and is not equal to M.

In some embodiments, memory controller 220 selects a first row address from the N number of row addresses associated with the ACT commands transmitted by memory controller 220 between the first pair of consecutive refresh management commands. When the conditions to transmit an RFM command are met (which may or may not be the second RFM command of the first pair), and based on the first row address, memory controller 220 (and refresh management control 223, in particular) selects at least a second row address to be refreshed (e.g., one or more rows that is physically and/or numerically adjacent to, or in the vicinity of, the row addressed by the first row address). In an embodiment, memory controller 220 may use a randomized selection technique to select the first row address from the N number of row addresses.

Memory controller 220 may also use the randomized selection technique to select a third row address from the M number of row addresses transmitted by memory controller 220 between the second pair of RFM commands. In some embodiments, the first pair of consecutive refresh management command and the second pair of consecutive refresh management commands may have a common refresh management command (i.e., memory controller 220 is transmitting alternating sets of N and M numbers of ACT commands between RFM commands.)

Figure 3:
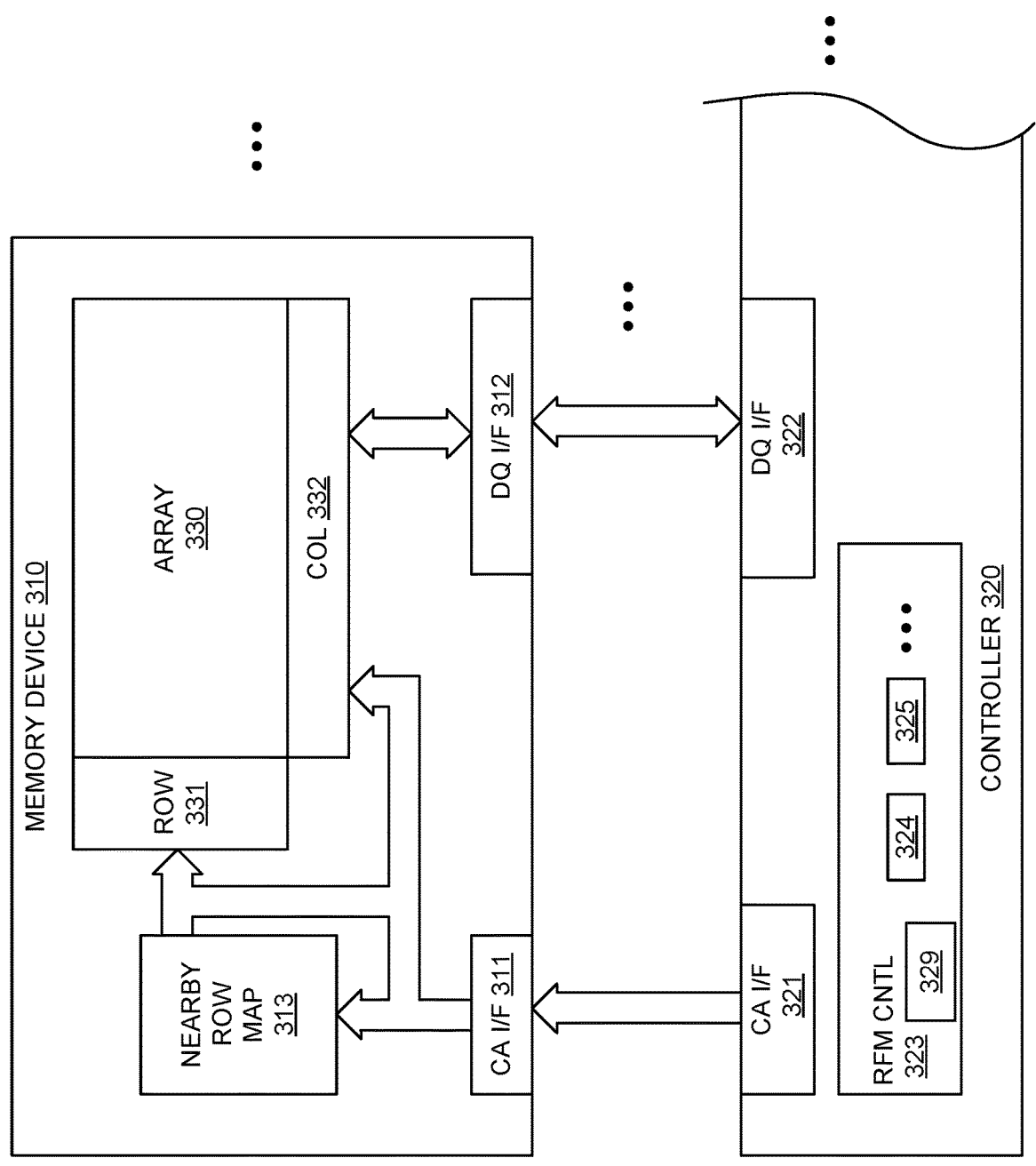
FIG. 3 is a block diagram illustrating a memory system with memory controller row address tracking.

FIG. 3 is a block diagram illustrating a memory system with memory controller row address tracking. In FIG. 3, memory system 300 comprises memory device 310 and memory controller 320. Memory device 310 includes command/address (CA) interface 311, data (DQ) interface 312, row map 313, memory array 330, row circuitry 331, and column circuitry 332. Controller 320 includes CA interface 321, DQ interface 322, and refresh management control 323. Refresh management control 323 includes configuration information 329, and selected address registers 324-325.

CA interface 321 of controller 320 is operatively coupled to CA interface 311 of memory device 310. CA interface 321 is operatively coupled to CA interface 311 to communicate commands and addresses (e.g., row and column addresses) from controller 320 to memory device 310. In an embodiment, the commands communicated from controller 320 to memory device 310 include activate (ACT) commands with an associated external row address, and refresh management (RFM) commands with an associated external row address.

Controller 320 is operatively coupled to memory device 310 via DQ interface 322 and DQ interface 312. Controller 320 and memory device 310 are operatively coupled via DQ interface 322 and DQ interface 312 to bidirectionally communicate data. Memory device 310 may store (e.g., in memory array 330) and retrieve (e.g., from memory array 330) data communicated via DQ interface 322 and DQ interface 312.

CA interface 311 of memory device 310 is operatively coupled to memory array 330. Row addresses received via CA interface 311 (a.k.a., external row addresses) in association with activate (ACT) commands are operatively coupled to memory array 330 via row circuitry 331 (e.g., row address decoders, buffers, etc.) Row addresses received via CA interface 311 (a.k.a., external row addresses) in association with refresh management (RFM) commands are operatively coupled to row map 313. Row map 313 uses row addresses received in association with RFM commands to determine which row or rows adjacent to, or in the vicinity of, the row addressed by the RFM command are to be refreshed in response to the RFM command. The row(s) address(es) to be refreshed are operatively coupled to row circuitry 331 (e.g., row address decoders, buffers, etc.) Column addresses received via CA interface 311 are operatively coupled to memory array 330 via column circuitry 332 (e.g., column address decoders, buffers, etc.).

Refresh management control 323 of controller 320 determines when and how often (e.g., number of intervening ACT commands between RFM commands) to transmit refresh management commands to memory device 310 via CA interface 321 and CA interface 311. For example, based on configuration information 329 (e.g., information received from memory device 310, mode, operating mode, programmed register value, programmed fuses, etc.), refresh management control 323 issues refresh management commands to memory device 310. In an embodiment, controller 320 transmits refresh management commands and associated row addresses to memory device 310 using varying numbers of activate commands between consecutive pairs of refresh management commands. In an embodiment, as described herein, the one or more row addresses provided in association with ACT command(s) may be stored in selected address register 324 and/or selected address register 325. These stored row addresses may be provided to memory device 310 by controller 320 in association with an RFM command. Memory device 310 (and row map 313, in particular) may use these received row addresses to determine row or rows adjacent to (or in the vicinity of) the received row addresses that are to be refreshed in response to the corresponding RFM command.

In some embodiments, controller 320 may alternate between two numbers of intervening activate commands between consecutive refresh management commands. For example, based on configuration information 329, controller 320 may transmit a first refresh management command, wait for N number (and/or approximately N number) of activate commands to be transmitted, issue a second refresh management command, wait for M number (and/or approximately M number) of activate commands to be transmitted (where N≠M), then issue a third refresh management command, again wait for N number (and/or approximately N number) of activate commands to be transmitted, issue a fourth refresh management command, and so forth. In some embodiments, based on configuration information 329, controller 320 may rotate between more than two numbers of intervening activate commands between consecutive refresh management commands. For example, controller 320 may rotate among transmitting N, M, and P numbers (and/or approximately N, M, and/or P numbers) of activate commands, where N≠M≠P.

When refresh management control 323 is to transmit a refresh management command (e.g., in response to a threshold number of ACT commands having been sent since the last RFM command), refresh management control 323 of controller 320 selects at least one row address to send in association with the RFM command. In an embodiment, refresh management control 323 algorithmically selects a row to be refreshed based on a row transmitted with (e.g., specified by) a selected previously transmitted activate command. For example, refresh management control 323 may select the row address that was transmitted with the Rth activate command after the last refresh management command was transmitted. For example, refresh management control 323 may select a row address that is the first (i.e., R=1) row address that was transmitted after the last refresh management command was transmitted. The address of this row (i.e., address transmitted with the ACT command) may be stored in selected address register 324 and/or selected address register 325. In another example, refresh management control 323 may select a row address activated by a median or near-middle (e.g., R=N/2 or R=M/2 for N and M numbers of activates between RFM commands, respectively, as appropriate, for the number of intervening activate commands between the last and current refresh management commands, etc.) or near last (e.g., R=N, N−1, etc., R=M, M−1, etc., as appropriate) activate command in the sequence of activate commands between RFM commands. In some embodiments, one or more other algorithmic techniques may be employed (e.g., linear feedback shift register, histogram, etc.) to select the activate command that determines the address of a row to be transmitted in association with a given RFM command.

In an embodiment, refresh management control 323 randomly selects, or uses a randomized selection technique (e.g., pseudo-random number generator) to select the activate command that determines the address of a row to be refreshed. For example, refresh management control 323 may select a row address that was activated by a randomly selected previously transmitted activate command. In an embodiment, the randomly selected activate command may be selected from a pool of previously transmitted activate commands. The row address associated with the selected activate command may be stored in selected address register 324 and/or selected address register 325. In an embodiment, the pool of previously transmitted activate commands comprises or is composed of the activate commands transmitted immediately preceding the last RFM command. In an embodiment, the pool of previously transmitted activate commands comprises or is composed of preceding activate commands transmitted in between a pair of RFM commands that does not include the next RFM command. In an embodiment, the sizes of the selection pools vary with the numbers of intervening activate commands between RFM commands (e.g., N and M). In an embodiment, the sizes of the selection pools (e.g., N and M) vary but the numbers of intervening activate commands between RFM commands remains the same (e.g., 32 intervening activates between each RFM command).

In an embodiment, memory controller 320 transmits, via CA interface 321 row activate (ACT) commands and refresh management (RFM) commands to a memory device 310. Memory device 310 receives these ACT and RFM commands via CA interface 311. Refresh management control 323, based on configuration information 329, determines a first number (N) of row activate commands to be transmitted between a first refresh management command and a second refresh management command. For example, based on configuration information 329, refresh management control 323 may configure controller 320 to transmit a first RFM command, followed by N number of ACT commands each associated with a respective row address. After the N number of ACT commands are transmitted, controller 320 is configured to transmit a second RFM command. Refresh management control 323 also, based on configuration information 329, determines a second number (M) of row activate commands to be transmitted between the second refresh management command and a third refresh management command. For example, based on configuration information 329, refresh management control 323 may configure controller 320 to transmit the second RFM command, followed by M number of ACT commands each associated with a respective row address. After the M number of ACT commands are transmitted, controller 320 is configured to transmit a third RFM command. Controller 320 may be configured to, after transmitting the third RFM command, transmit another N number of ACT commands, followed by an RFM command, then followed by M number of ACT commands, followed by another RFM command, and so on, alternating between sets of N and M ACT commands between RFM commands.

In an embodiment, memory controller 320 receives, from the memory device 310, an indicator associated with an average number of ACT commands to be transmitted between successive RFM commands. Thus, one of N and M may be greater than the average number of ACT commands to be transmitted between successive RFM commands and the other of N and M may be less than the average. In an embodiment, the average of N and M may be less than, equal to, or greater than the average number of ACT commands to be transmitted between successive RFM commands.

In an embodiment, memory controller 320 (and refresh management control 323, in particular) selects a first row address from the N number of row addresses transmitted in association with the ACT commands transmitted by memory controller 320 between the first RFM command and the second RFM command. When the conditions for transmitting a second RFM command are met, and based on the first row address (e.g., stored in selected address register 324), memory controller 320 selects a row address to be transmitted in association with the RFM command (e.g., the first row address.) This selected row address may be translated by row map 313 in memory device 310 into row address(es) of one or more rows adjacent to (or in the vicinity of) the selected row address that are to be refreshed.

Memory controller 320 (and refresh management control 323, in particular) may also select a second row address from the M number of row addresses transmitted in association with the ACT commands transmitted by memory controller 320 between the second RFM command and the third RFM command. In an embodiment, N is not equal to M. When the conditions to transmit the third RFM command are met, and based on the second row address (e.g., stored in selected address register 325), memory controller 320 selects a row address to be transmitted in association with the third RFM command (e.g., the second row address.) This selected row address may be translated by row map 313 in memory device 310 into row address(es) of one or more rows adjacent to (or in the vicinity of) the selected row address that are to be refreshed.

In an embodiment, memory controller 320 is configured to transmit, via CA interface 321, N number of row activate (ACT) commands between a first pair of consecutive refresh management commands. Memory controller 320 is also configured to transmit, via CA interface 321, M number of ACT commands between a second pair of consecutive refresh management commands, where N and M are positive integers that are not equal.

In some embodiments, memory controller 320 may also transmit, via CA interface 321, P number of row activate (ACT) commands between a third pair of consecutive refresh management commands where P is a positive integer that is not equal to N and is not equal to M.

In some embodiments, memory controller 320 selects a first row address from the N number of row addresses associated with the ACT commands transmitted by memory controller 320 between the first pair of consecutive refresh management commands. When the conditions to transmit an RFM command are met (which may or may not be the second RFM command of the first pair), and based on the first row address, memory controller 320 (and refresh management control 323, in particular) selects a row address to be transmitted in association with the second RFM command (e.g., the first row address). This selected row address may be translated by row map 313 in memory device 310 into row address(es) of one or more rows adjacent to (or in the vicinity of) the selected row address that are to be refreshed. In an embodiment, memory controller 320 may use a randomized selection technique to select a row address from the N number of row addresses.

Memory controller 320 may also use the randomized selection technique to select a second row address from the M number of row addresses transmitted by memory controller 320 between the second pair of RFM commands. This selected row address may be transmitted in association with a third RFM command (e.g., the second row address). This selected row address may be translated by row map 313 in memory device 310 into row address(es) of one or more rows adjacent to (or in the vicinity of) the selected row address that are to be refreshed. In some embodiments, the first pair of consecutive refresh management command and the second pair of consecutive refresh management commands may have a common refresh management command (i.e., memory controller 320 is transmitting alternating sets of N and M numbers of ACT commands between RFM commands.)

Figure 4:
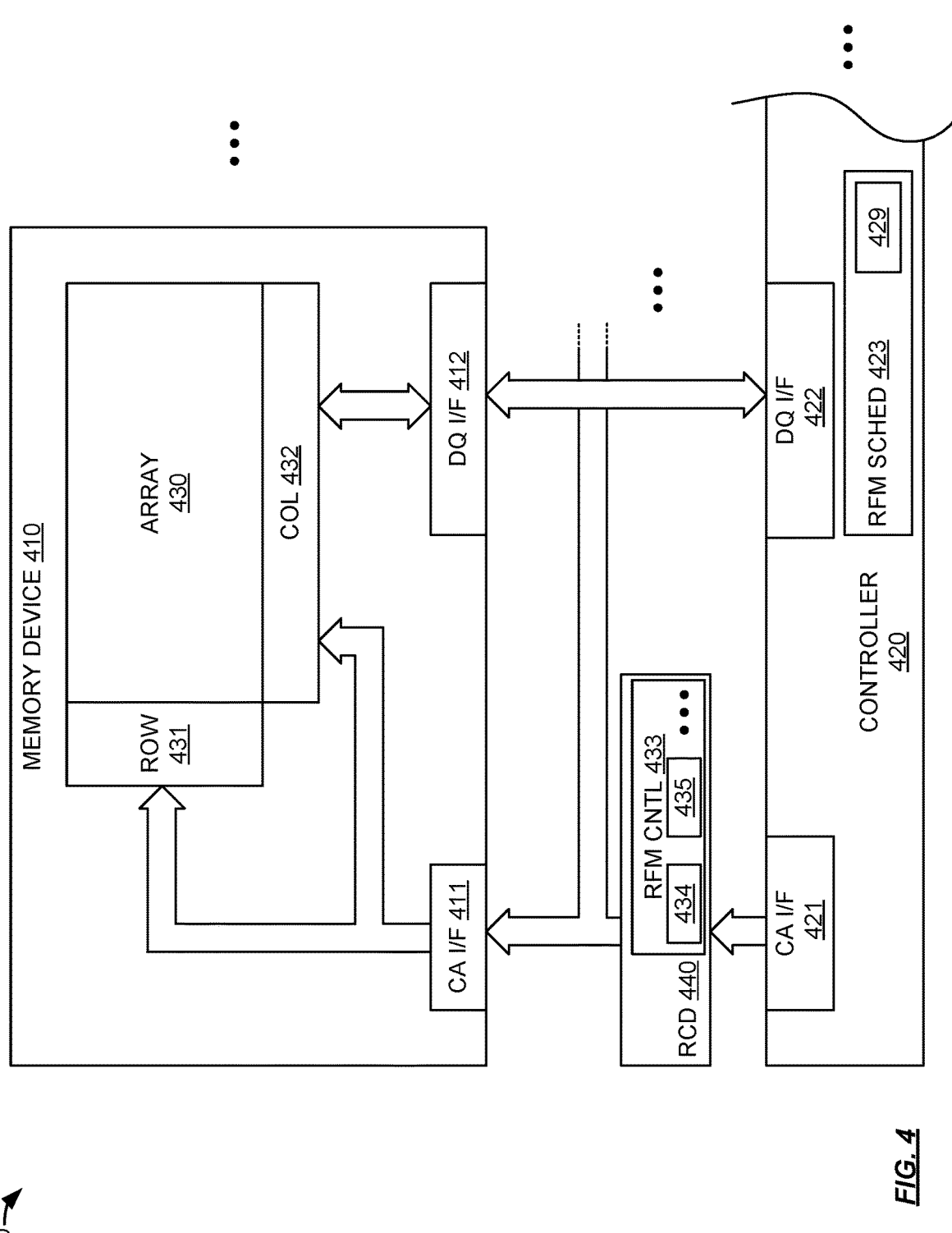
FIG. 4 is a block diagram illustrating a memory system with registering clock driver refresh management selection.

FIG. 4 is a block diagram illustrating a memory system with registering clock driver refresh management selection. In FIG. 4, memory system 400 comprises memory device 410, memory controller 420, and registering clock driver (RCD) 440. Memory device 410 includes command/address (CA) interface 411, data (DQ) interface 412, memory array 430, row circuitry 431, and column circuitry 432. Controller 420 includes CA interface 421, DQ interface 422, and refresh management scheduler 423. Refresh management scheduler 423 includes configuration information 429. Registering clock driver (RCD) 440 includes refresh management control 433. Refresh management control 433 includes selected address register 434 and selected address register 435.

CA interface 421 of controller 420 is operatively coupled to CA interface 411 of memory device 410 via RCD 440. RCD 440 may also couple additional memory devices (not shown in FIG. 4) to CA interface 421 of controller 420. CA interface 421 is operatively coupled to CA interface 411 via RCD 440 to communicate commands and addresses (e.g., row and column addresses) from controller 420 to memory device 410. In an embodiment, the commands communicated from controller 420 to memory device 410 include activate (ACT) commands with an associated external row address, and refresh management (RFM) commands.

Controller 420 is operatively coupled to memory device 410 via DQ interface 422 and DQ interface 412. Controller 420 and memory device 410 are operatively coupled via DQ interface 422 and DQ interface 412 to bidirectionally communicate data. Memory device 410 may store (e.g., in memory array 430) and retrieve (e.g., from memory array 430) data communicated via DQ interface 422 and DQ interface 412.

CA interface 411 of memory device 410 is operatively coupled to memory array 430. Row addresses received via CA interface 411 (a.k.a., external row addresses) in association with activate commands are operatively coupled to memory array 430 via row circuitry 431 (e.g., row address decoders, buffers, etc.) Column addresses received via CA interface 411 are operatively coupled to memory array 430 via column circuitry 432 (e.g., column address decoders, buffers, etc.).

One or more row addresses received by RCD 440 in association with activate commands may be provided to refresh management control 433. As described herein, the one or more row addresses provided to refresh management control 433 may be stored in selected address register 434 and/or selected address register 435.

In an embodiment, refresh management control 433 performs similar or substantially the same functions as one or more of refresh management control 113, refresh control 223, and/or refresh control 323, except that RCD 440 may be coupled to multiple memory devices and thereby perform the refresh management control functions for all of those memory devices. These functions include, for example, the selection of rows to be refresh in response to refresh management commands in the manners described herein. Accordingly, reference is made to the refresh management control 113 functions described with reference to FIG. 1. Therefore, for the sake of brevity, the description of the functions of refresh management control 433 (which are substantially the same or similar to the functions of refresh management control 113) will not be repeated here with reference to FIG. 4.

Figure 5A:
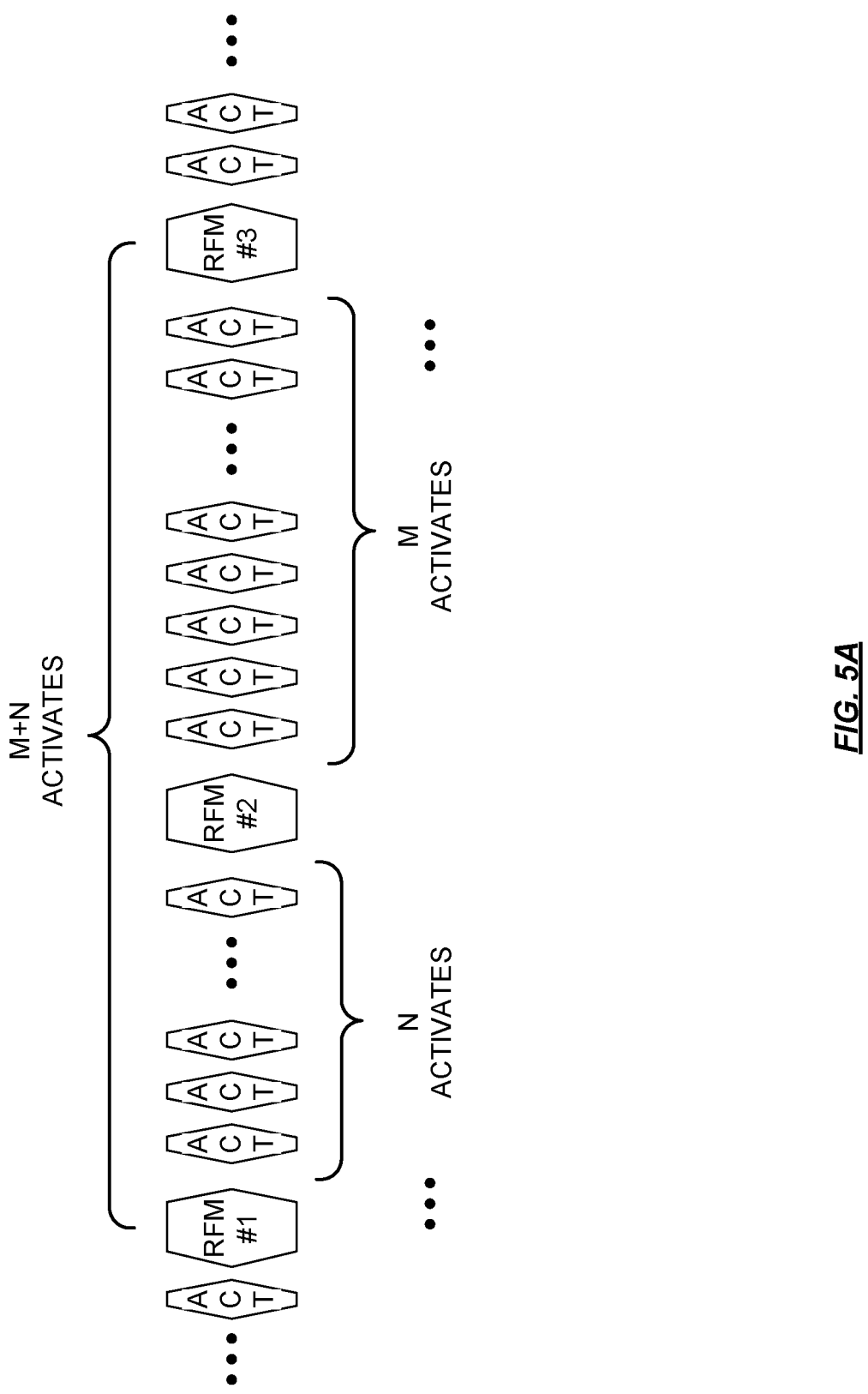
FIGS. 5A-5B are diagrams illustrating refresh management command occurrence.
Figure 5B:
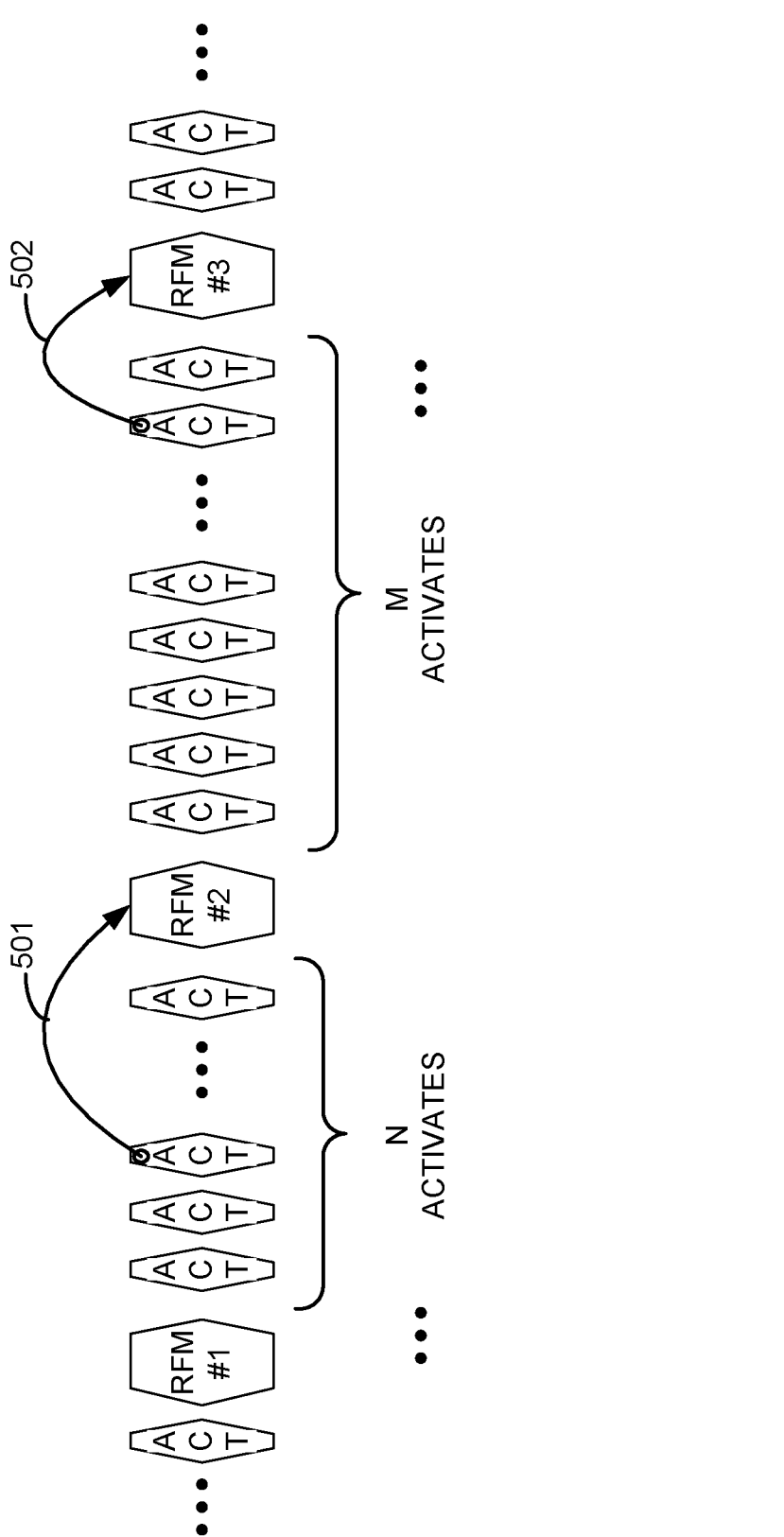

FIGS. 5A-5B are diagrams illustrating refresh management command occurrence. In FIGS. 5A-5B, a first refresh management command (RFM #1) is illustrated being issued (e.g., by controller 120, controller 220, and/or controller 320). RFM #1 is followed by N number of row activate (ACT) commands being issued. Following the N number of activates, a second refresh management command (RFM #2) is illustrated being issued. RFM #2 is followed by M number of ACT commands being issued. Following the M number of activates, a third refresh management command (RFM #3) is illustrated being issued. Thus, the total number of ACT commands issued between RFM #1 and RFM #3 is M+N. It should be understood, therefore, that over the period from the end of RFM #1 to the completion of RFM #3, two RFM commands are performed and M+N ACT commands are performed. That results in an average number of ACT commands per RFM command of Avg=(M+N)/2. In an embodiment, N and M are not equal, but an indicated ratio of RFM to ACT commands is, on average, met. For example, if the maximum number of ACT commands per RFM command is indicated as 32, selecting N=61 and M=3 will, on average (i.e., [61+3]/2=32), satisfy the indicated (or required, or configured) ratio of at least one RFM command every 32 ACT commands.

FIG. 5B illustrates the selection of a row for the RFM commands. In FIG. 5B, a row from the N number of ACT commands preceding RFM #2 is selected as the basis for the row refreshed by RFM #2. This is illustrated in FIG. 5B by arrow 501 running from an ACT command of the N number of ACT commands between RFM #1 and RFM #2 to RFM #2. Also in FIG. 5B, a row from the M number of ACT commands preceding RFM #3 is selected as the basis for the row refreshed by RFM #3. This is illustrated in FIG. 5B by arrow 502 running from an ACT command of the M number of ACT commands between RFM #2 and RFM #3 to RFM #3. The rows illustrated by arrows 501-502 may be selected, for example, algorithmically (e.g., by RFM control 113, RFM control 223, and/or RFM control 333) and/or using a randomized process, as described herein.

Figure 6A:
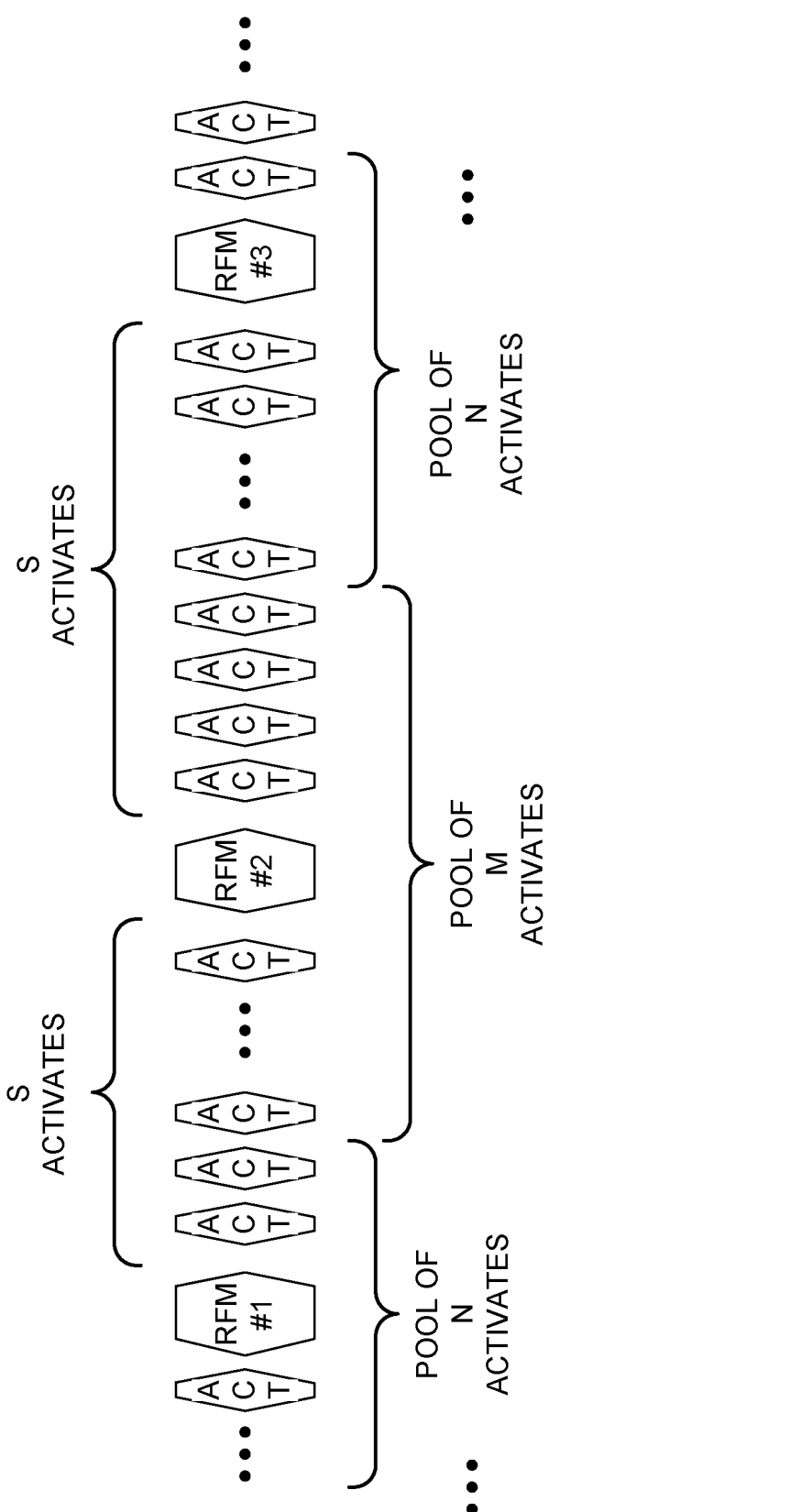
FIGS. 6A-6B are diagrams illustrating refresh management row selection.
Figure 6B:
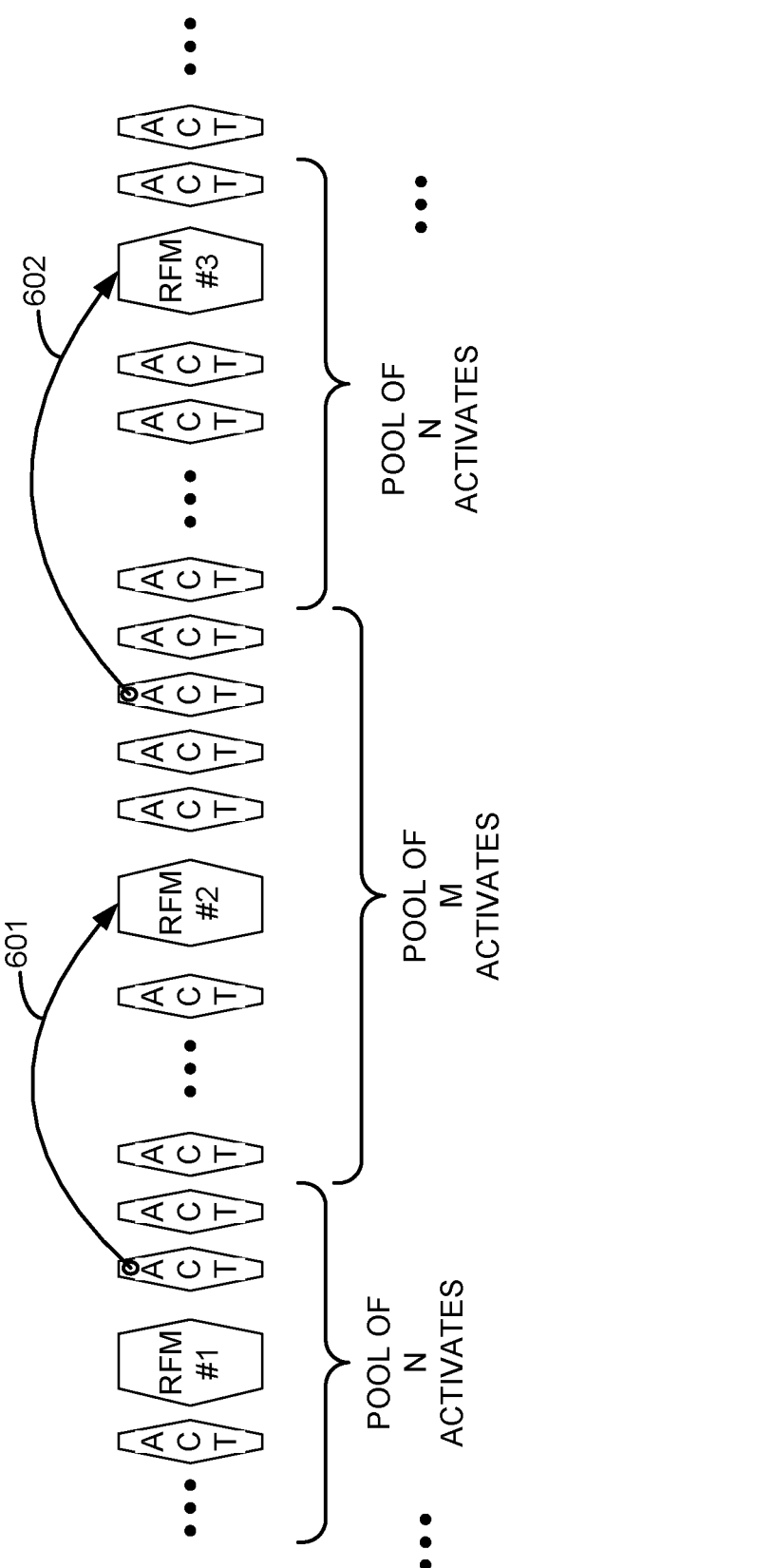

FIGS. 6A-6B are diagrams illustrating refresh management row selection. In FIGS. 6A-6B, a first refresh management command (RFM #1) is illustrated being issued (e.g., by controller 120, controller 220, and/or controller 320). RFM #1 is followed by S number of row activate (ACT) commands being issued. Following the S number of activates, a second refresh management command (RFM #2) is illustrated being issued. RFM #2 is also followed by S number of ACT commands being issued. Following the second S number of activates, a third refresh management command (RFM #3) is illustrated being issued. The two sets of S number of activates are divided into two pools with N number of activates and M number of activates, respectively. Thus, the total number of ACT commands issued between RFM #1 and RFM #3 is 2S=M+N. It should be understood, therefore, that between each RFM command, S number of ACT commands are performed. S may be a number that is selected and/or configured to eliminate, reduce, or mitigate the effects of row hammer.

In an embodiment, N and M are not equal. For example, if the number of ACT commands per RFM command is indicated as S=32, selecting N=61 and M=3 will, result in two pools that are comprised or composed of the intervening ACT commands between three RFM commands (or two pairs of RFM commands).

FIG. 6B illustrates the selection of a row for the RFM commands. In FIG. 6B, a row from the pool with N number of ACT commands preceding RFM #2 is selected as the basis for the row refreshed by RFM #2. This is illustrated in FIG. 6B by arrow 601 running from an ACT command in the pool with N number of ACT commands to RFM #2. Also in FIG. 6B, a row from the pool with M number of ACT commands preceding RFM #3 is selected as the basis for the row refreshed by RFM #3. This is illustrated in FIG. 6B by arrow 602 running from an ACT command in the pool with M number of ACT commands to RFM #3. The rows illustrated by arrows 601-602 may be selected, for example, algorithmically (e.g., by RFM control 113, RFM control 223, and/or RFM control 333) and/or using a randomized process, as described herein.

FIG. 7 is a flowchart illustrating a method of issuing refresh management commands. One or more steps illustrated in FIG. 7 may be performed by, for example, memory system 100, memory system 200, memory system 300, memory system 400, and/or their components. A first number of row activate commands are transmitted to a memory device, between a first pair of consecutive refresh management commands (702). For example, controller 220 may transmit, to memory device 210, N number of row activate commands between a first refresh management command and a second refresh management command without any intervening refresh management commands being transmitted between the first refresh management command and the second refresh management command.

A second number of row activate commands are transmitted to the memory device between a second pair of consecutive refresh management commands, wherein the first and second numbers are not equal (704). For example, controller 220 may transmit, to memory device 210, M number of row activate commands between the second refresh management command and a third refresh management command without any intervening refresh management commands being transmitted between the second refresh management command and the third refresh management command, where N is not equal to M.

FIG. 8 is a flowchart illustrating a method of selecting refresh management command occurrences. One or more steps illustrated in FIG. 8 may be performed by, for example, memory system 100, memory system 200, memory system 300, memory system 400, and/or their components. From a memory device, an indicator of a selected number of row activate commands to be transmitted between pairs of consecutive refresh management commands is received (802). For example, controller 220 may receive, from memory device 210, configuration information 229 that includes an indicator of the number (or maximum number—e.g., 32) of row activate commands to be transmitted to memory device 210 between refresh management commands.

A first number of row activate commands are transmitted to the memory device between a first pair of consecutive refresh management commands, wherein the first number is not equal to the selected number (804). For example, controller 220 may transmit, to memory device 210, N number of row activate commands between a first refresh management command and the next (second) refresh management command where N (e.g., 61) is not equal to the number (or maximum number) of row activate commands indicated by memory device 210 to be transmitted to memory device 210 between refresh management commands.

A second number of row activate commands are transmitted to the memory device between a second pair of consecutive refresh management commands, wherein the second number is not equal to the selected number and the first and second numbers are not equal (806). For example, controller 220 may transmit, to memory device 210, M number of row activate commands between the second refresh management command and the next following (third) refresh management command, where M (e.g., 3) is not equal to the number (or maximum number) of row activate commands indicated by memory device 210 to be transmitted to memory device 210 between refresh management commands, and is also not equal to N.

FIG. 9 is flowchart illustrating a method of selecting refresh management command row addresses. One or more steps illustrated in FIG. 9 may be performed by, for example, memory system 100, memory system 200, memory system 300, memory system 400, and/or their components. From a memory device, an indicator of a selected number of row activate commands to be transmitted between pairs of consecutive refresh management commands is received (902). For example, controller 220 may receive, from memory device 210, configuration information 229 that includes an indicator of the number (or maximum number—e.g., 32) of row activate commands to be transmitted to memory device 210 between refresh management commands.

A first plurality of row activate commands are transmitted to the memory device (904). For example, memory controller 220 may transmit, to memory device 210, N number of row activate commands, where N is a positive integer greater than one. In an example, the N number of row activate commands are not all transmitted consecutively. A first row that is associated with a one of the first plurality of row activate commands is selected (906). For example, memory controller 220 may algorithmically and/or use a randomized process to select a row that was activated by a one of the N number of row activate commands recently transmitted by controller 220. A first refresh management command is transmitted to cause a refresh of a row physically adjacent to the first row (908). For example, controller 220 may transmit, to memory device 210, a refresh management command in association with a row address that will cause a row physically adjacent to the selected row that was activated by the one of the N number of row activate commands recently transmitted. In another example, controller 220 may transmit, to memory device 210, a refresh management command in association with a row address that will cause multiple rows physically adjacent to, or in the vicinity of (e.g., 2 rows away, 1 to 3 rows next to, 8 rows surrounding, etc.), the selected row that was activated by the one of the N number of row activate commands recently transmitted.

A second plurality of row activate commands are transmitted to the memory device wherein the number of activate commands in the first plurality and the second plurality are not equal (910). For example, memory controller 220 may transmit, to memory device 210, M number of row activate commands, where M is a positive integer greater than one. In an example, the M number of row activate commands are not all transmitted consecutively. A second row that is associated with a one of the second plurality of row activate commands is selected (912). For example, memory controller 220 may algorithmically and/or use a randomized process to select a row that was activated by a one of the M number of row activate commands recently transmitted by controller 220. A second refresh management command is transmitted to cause a refresh of a row physically adjacent to the second row (914). For example, controller 220 may transmit, to memory device 210, a refresh management command in association with a row address that will cause a refresh of a row physically adjacent to the selected row that was activated by the one of the M number of row activate commands recently transmitted. In another example, controller 220 may transmit, to memory device 210, a refresh management command in association with a row address that will cause multiple rows physically adjacent to, or in the vicinity of (e.g., 2 rows away, 1 to 3 rows next to, 8 rows surrounding, etc.), the selected row that was activated by the one of the N number of row activate commands recently transmitted.

Figure 10:
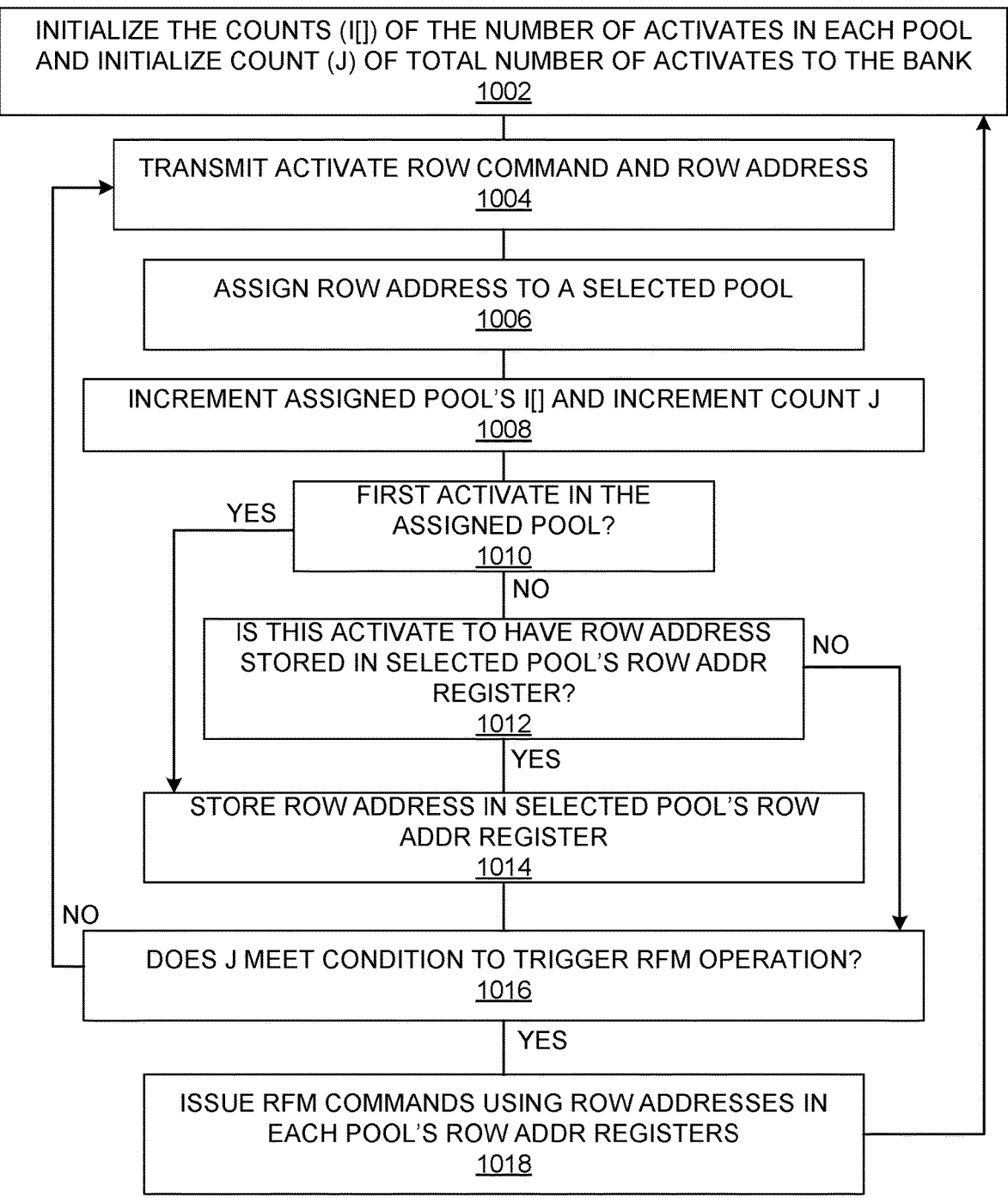
FIG. 10 is a flowchart illustrating a method of issuing refresh management commands and associated rows.

FIG. 10 is a flowchart illustrating a method of issuing refresh management commands and associated rows. One or more steps illustrated in FIG. 10 may be performed by, for example, memory system 100, memory system 200, memory system 300, memory system 400, and/or their components. The count (i[ ]) of the number of activates in each pool and a count (j) of the total number of activates to a bank are initialized (1002). For example, controller 220 may initialize an array of counters (e.g., i[1:Q]—one for each of Q number of pools) associated with pools that the row activate commands (or rows) between refresh management commands are to be assigned to and/or associated with. Controller 220 may also initialize a counter (j) of the total number of activates directed to a given bank. In an embodiment, there is a corresponding array of counters i[ ] and counter j for each bank. In other words, if there are four banks, (e.g., in memory device 130), then four arrays of counters i[ ] and four counters j may be maintained.

An activate row command and row address are received (1004). For example, controller 220 may transmit, to memory device 210, an activate row (ACT) command in association with a row address to be activated. The row address is assigned to a selected pool (1006). For example, controller 220 may assign the row address associated with the transmitted ACT command to a selected one of the Q number of pools. Controller 220 may make this assignment algorithmically and/or using a randomized selection technique as described herein.

The assigned pool's counter (i[ ]) and the bank counter (j) are both incremented (1008). For example, if the row associated with the last ACT command is assigned to pool #3, the counter i[3] may be incremented by controller 220. Likewise, the bank counter j associated with the last ACT command may also be incremented by controller 220. If this row is the first activate assigned to the selected pool, flow proceeds to box 1014. If there is at least one other row already assigned to the selected pool, flow proceeds to box 1012 (1010). In box 1012, it is determined whether to have the row address of the last ACT command stored in the selected pool's row address register (1012). If it is to be stored, flow proceeds to box 1014. If it is not to be stored, flow proceeds to box 1016. For example, controller 220 may determine whether to store the last ACT command's row address in the row address register of the selected pool. Controller 220 may make this assignment algorithmically and/or using a randomized selection technique as described herein.

In an example, controller 220 may generate a random number that may be compared to a threshold where the threshold is based on the count of row addresses assigned to the selected pool. For example, using a random number between 0 and 1.0, if the selected pool has one (1) row address currently associated with it, controller 220 may set the threshold at 0.5. Thus, if the random number generated in this round is 0.5 or less, the current number in the pool's row address register is not displaced. If the random number generated in this round is more than 0.5, then the current number in the pool's row address register is replaced by the last ACT command's row address. In other related examples, if the selected pool has two (2) row addresses currently associated with it, controller 220 may set the threshold at ⅔; 3 row addresses may set a threshold of ¾; four address sets a threshold of ⅘, and so on.

In box 1014, the row address of last ACT command is stored in the row address register of the selected pool (1014). If the bank counter (j) meets the condition(s) to trigger a refresh management operation, flow proceeds to box 1018. If the bank counter (j) does not meet the condition(s) to trigger a refresh management operation, flow proceeds back to box 1004 (1016). In box 1018, refresh management commands are issued using the row addresses in each pool's row address register (1018). For example, if there were two pools (e.g., A and B), controller 220 may issue a first RFM command based on the row address in pool A's row address register and also issue a second RFM command based on the row address in pool B's row address register.

Figure 11:
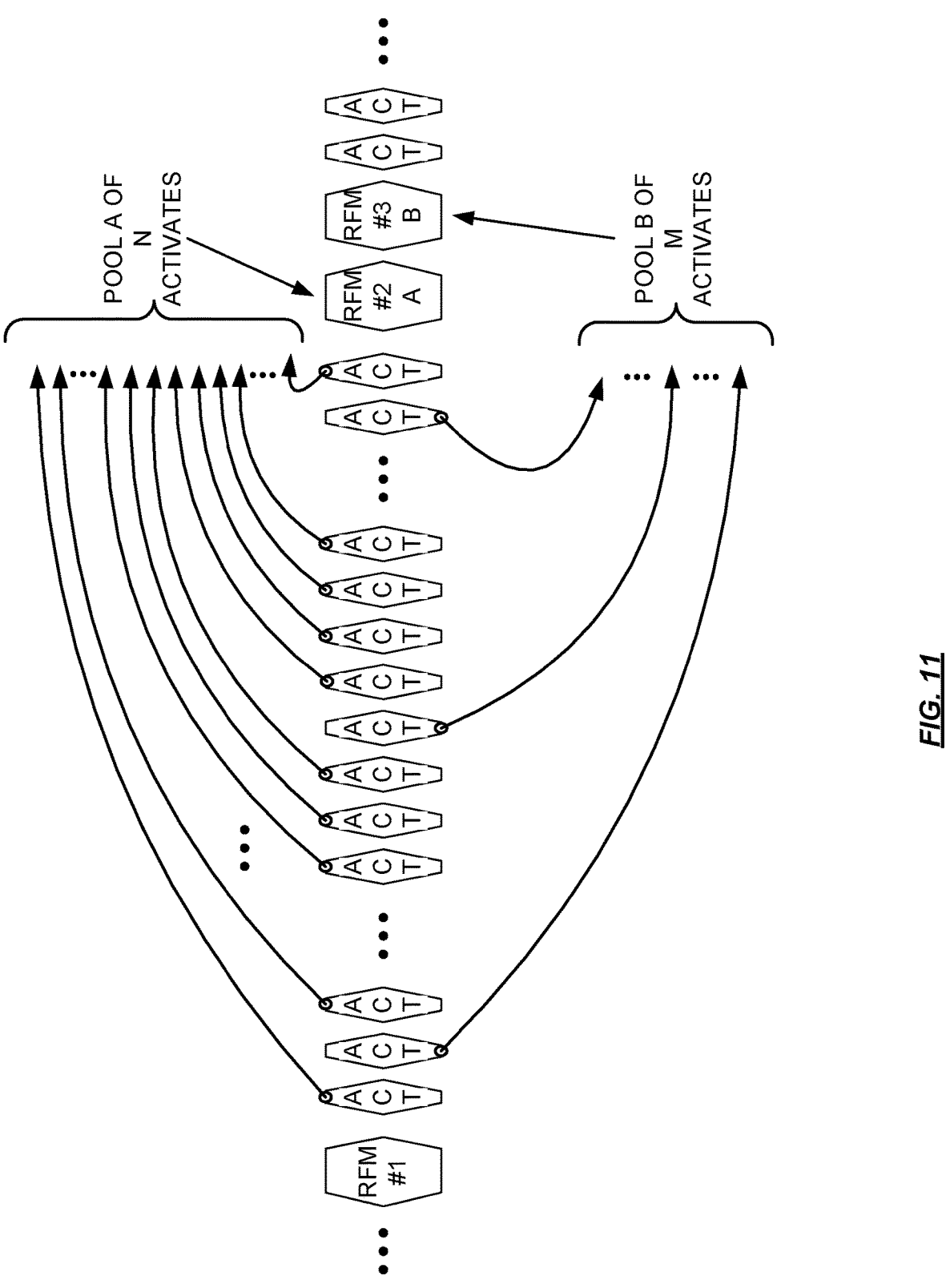
FIG. 11 is a diagram illustrating refresh management commands with rows selected from a plurality of pools.

FIG. 11 is a diagram illustrating refresh management commands with rows selected from a plurality of pools. In FIG. 11, a sequence of row activate commands are assigned to one of two pools (A or B). Once the condition(s) for refresh management commands to be issued is met, a first row address (A) is selected from pool A (with N activates) for refresh management command RFM #2 and a second row address (B) is selected from pool B (with M activates) for refresh management command RFM #3. FIG. 11 may be viewed as an example illustration of the functions and sequence of commands that may result from the flowchart illustrated in FIG. 10.

FIG. 12 is a flowchart illustrating a method of issuing refresh management commands and associated rows. One or more steps illustrated in FIG. 12 may be performed by, for example, memory system 100, memory system 200, memory system 300, memory system 400, and/or their components. A pool group is activated (1202). For example, controller 220 may associate row address pools into groups to better schedule refresh management commands on a more regular basis. Controller 220 may alternate between pool groups such that one group is the source for the rows in RFM commands as another group is accumulating and assigning rows to pools.

The count (i[ ]) of the number of activates in each pool of the active pool group and a count (j) of the total number of activates to a bank are initialized (1203). For example, controller 220 may initialize an array of counters (e.g., i[1:Q]—one for each of Q number of pools in the active pool group) associated with pools in the active group that the row activate commands (or rows) between refresh management commands are to be assigned to and/or associated with. Controller 220 may also initialize a counter (j) of the total number of activates directed to a given bank.

An activate row command and row address are received (1204). For example, controller 220 may transmit, to memory device 210, an activate row (ACT) command in association with a row address to be activated. The row address is assigned to a selected pool in the active pool group (1206). For example, controller 220 may assign the row address associated with the transmitted ACT command to a selected one of the Q number of pools in the active pool group. Controller 220 may make this assignment algorithmically and/or using a randomized selection technique as described herein.

The assigned pool's counter (i[ ]) and the bank counter (j) are both incremented (1208). For example, if the row associated with the last ACT command is assigned to pool

3, the counter i[3] may be incremented by controller 220. Likewise, the bank associated with the last ACT command may also be incremented by controller 220. If this row is the first activate assigned to the selected pool, flow proceeds to box 1214. If there is at least one other row already assigned to the selected pool, flow proceeds to box 1212 (1210). In box 1212, it is determined whether to have the row address of the last ACT command stored in the selected pool's row address register (1212). If it is to be stored, flow proceeds to box 1214. If it is not to be stored, flow proceeds to box 1216. For example, controller 220 may determine whether to store the last ACT command's row address in the row address register of the selected pool. Controller 220 may make this assignment algorithmically and/or using a randomized selection technique as described herein.

In an example, controller 220 may generate a random number that may be compared to a threshold where the threshold is based on the count of row addresses assigned to the selected pool. For example, using a random number between 0 and 1.0, if the selected pool has one (1) row address currently associated with it, controller 220 may set the threshold at 0.5. Thus, if the random number generated in this round is 0.5 or less, the current number in the pool's row address register is not displaced. If the random number generated in this round is more than 0.5, then the current number in the pool's row address register is replaced by the last ACT command's row address. In other related examples, if the selected pool has two (2) row addresses currently associated with it, controller 220 may set the threshold at ⅔; 3 row addresses may set a threshold of ¾; four address sets a threshold of ⅘, and so on.

In box 1214, the row address of last ACT command is stored in the row address register of the selected pool from the active pool group (1214). If the bank counter (j) meets the condition(s) to trigger a refresh management operation, flow proceeds to box 1218. If the bank counter (j) does not meet the condition(s) to trigger a refresh management operation, flow proceeds back to box 904 (1216). In box 1218, a refresh management command is issued using a row addresses in a selected pool's row address register (1218). For example, if there were two pools (e.g., A and B) in each pool group, controller 220 may alternately issue a first RFM command based on the row address in pool A's (of the active group) row address register and then the next time the condition(s) to trigger a refresh management operation is met, issue a second RFM command based on the row address in pool B's (of the active group) row address register. After each of the pools in a pool group have been the source for the row address of an RFM command, a different pool group may be selected in box 1202.

Figure 13:
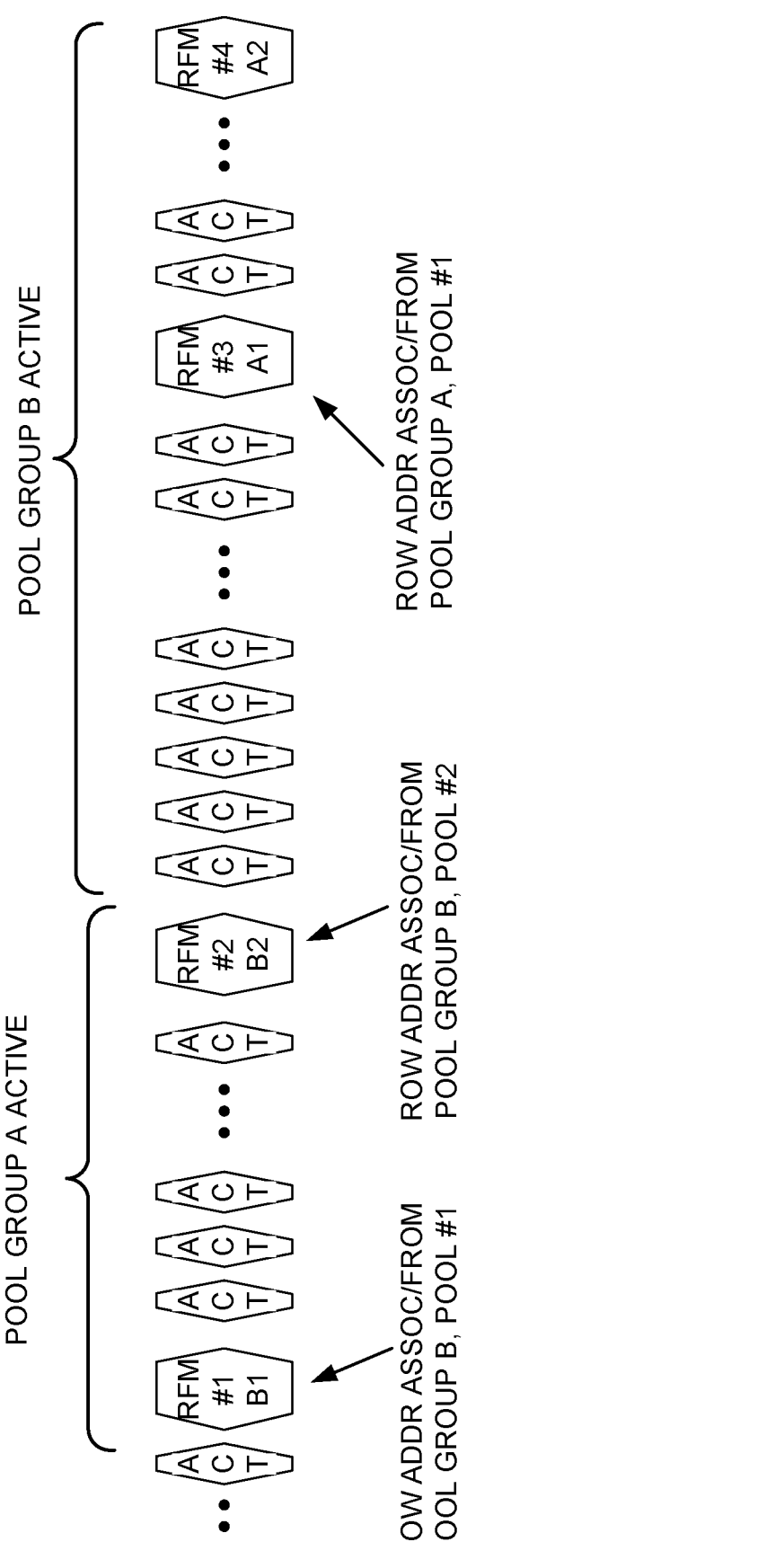
FIG. 13 is a diagram illustrating refresh management commands with rows selected from a plurality of pools organized into a plurality of pool groups.

FIG. 13 is a diagram illustrating refresh management commands with rows selected from a plurality of pools organized into a plurality of pool groups. In FIG. 10, a sequence of row activate commands are assigned to pool #1 or #2 of pool group A or pool group B. Once the condition(s) for refresh management commands to be issued is met, a first row address (B1) is selected from pool #1 of pool group B for refresh management command RFM #1 while pool group A is gathering row addresses. Once the condition(s) for refresh management commands to be issued is met a next time, a second row address (B2) is selected from pool #2 of pool group B for refresh management command RFM #2 while pool group A is gathering row addresses. Since all of the pools (i.e., #1 and #2) of pool group B have now provided a row address for an RFM command, pool B starts to gather row addresses.

Once the condition(s) for another refresh management command to be issued is met, a third row address (A1) is selected from pool #1 of pool group A for refresh management command RFM #3 while pool group B is gathering row addresses. Once the condition(s) for refresh management commands to be issued is met yet another time, a fourth row address (A2) is selected from pool #2 of pool group A for refresh management command RFM #4 while pool group B is gathering row addresses. Since all of the pools (i.e., #1 and #2) of pool group A have now provided a row address for an RFM command, pool A starts to gather row addresses while pool B provides row addresses for RFM commands, and so on. FIG. 13 may be viewed as an example illustration of the functions and sequence of commands that may result from the flowchart illustrated in FIG. 12.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of memory system 100, memory system 200, memory system 300, memory system 400, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 14:
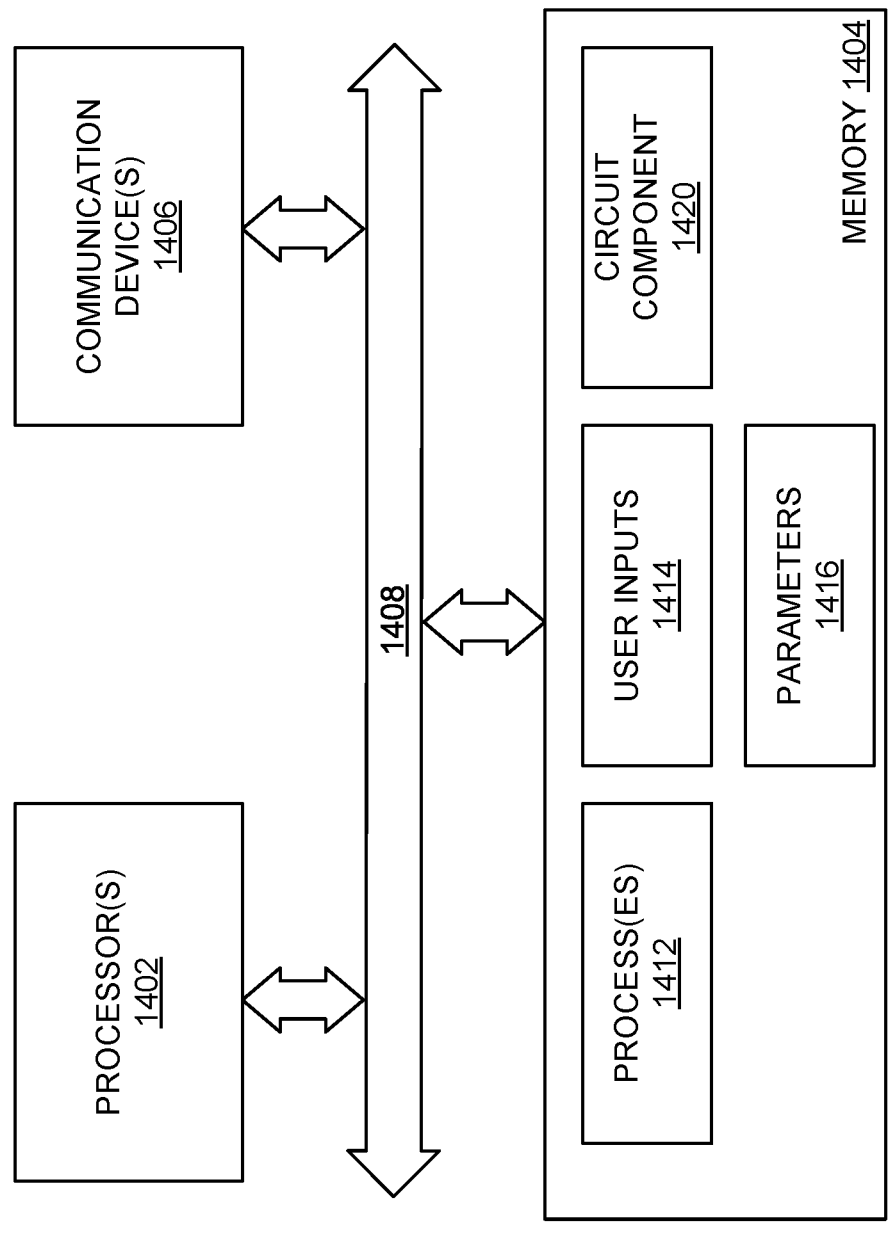
FIG. 14 is a block diagram illustrating a processing system.

FIG. 14 is a block diagram illustrating one embodiment of a processing system 1400 for including, processing, or generating, a representation of a circuit component 1420. Processing system 1400 includes one or more processors 1402, a memory 1404, and one or more communications devices 1406. Processors 1402, memory 1404, and communications devices 1406 communicate using any suitable type, number, and/or configuration of wired and/or wireless connections 1408.

Processors 1402 execute instructions of one or more processes 1412 stored in a memory 1404 to process and/or generate circuit component 1420 responsive to user inputs 1414 and parameters 1416. Processes 1412 may be any suitable electronic design automation (EDA) tool or portion thereof used to design, simulate, analyze, and/or verify electronic circuitry and/or generate photomasks for electronic circuitry. Representation 1420 includes data that describes all or portions of memory system 100, memory system 200, memory system 300, and their components, as shown in the Figures.

Representation 1420 may include one or more of behavioral, register transfer, logic component, transistor, and layout geometry-level descriptions. Moreover, representation 1420 may be stored on storage media or communicated by carrier waves.

Data formats in which representation 1420 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1414 may comprise input parameters from a keyboard, mouse, voice recognition interface, microphone and speakers, graphical display, touch screen, or other type of user interface device. This user interface may be distributed among multiple interface devices. Parameters 1416 may include specifications and/or characteristics that are input to help define representation 1420. For example, parameters 1416 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1404 includes any suitable type, number, and/or configuration of non-transitory computer-readable storage media that stores processes 1412, user inputs 1414, parameters 1416, and circuit component 1420.

Communications devices 1406 include any suitable type, number, and/or configuration of wired and/or wireless devices that transmit information from processing system 1400 to another processing or storage system (not shown) and/or receive information from another processing or storage system (not shown). For example, communications devices 1406 may transmit circuit component 1420 to another system. Communications devices 1406 may receive processes 1412, user inputs 1414, parameters 1416, and/or circuit component 1420 and cause processes 1412, user inputs 1414, parameters 1416, and/or circuit component 1420 to be stored in memory 1404.

Implementations discussed herein include, but are not limited to, the following examples:

Example 1: A memory controller, comprising: a command interface to transmit row activate (ACT) commands and refresh management (RFM) commands to a memory device; and, control circuitry to determine a first number of row activate commands to be transmitted between a first refresh management command and a second refresh management command, and to determine a second number of row activate commands to be transmitted between the second refresh management command and a third refresh management command, the first number and the second number to be unequal.

Example 2: The memory controller of example 1, wherein the memory controller receives, from the memory device, a first indicator associated with a third number of row activate commands.

Example 3: The memory controller of example 2, wherein the first number is greater than the third number and the second number is less than the third number.

Example 4: The memory controller of example 2, wherein an average of the first number and the second number is not equal to the third number.

Example 5: The memory controller of example 2, wherein the memory device selects a first row address from a first plurality of row addresses received in association with a first plurality of row activate commands received by the memory device between the first refresh management command and the second refresh management command and, in response to the second refresh management command and based on the first row address, selects at least a second row address to be refreshed.

Example 6: The memory controller of example 5, wherein the memory device selects a third row address from a second plurality of row addresses received in association with a second plurality of row activate commands received by the memory device between the second refresh management command and the third refresh management command and, in response to the third refresh management command and based on the third row address, selects at least a fourth row address to be refreshed.

Example 7: The memory controller of example 5, wherein a first row addressed by the first row address is physically adjacent to a second row addressed by the second row address.

Example 8: A memory controller, comprising: a command interface to transmit a first number of row activate (ACT) commands between a first pair of consecutive refresh management commands, and to transmit a second number of row activate commands between a second pair of consecutive refresh management commands; wherein the first number and the second number are not equal.

Example 9: The memory controller of example 8, wherein the command interface is to also transmit a third number of row activate commands between a third pair of consecutive refresh management commands, and the third number is not equal to the first number and is not equal to the second number.

Example 10: The memory controller of example 8, wherein the memory device selects a first row address from a first plurality of row addresses received by the memory device between the first pair of consecutive refresh management commands and, in response to a first refresh management command and based on the first row address, selects at least a second row address to be refreshed.

Example 11: The memory controller of example 10, wherein the memory device uses a randomized selection technique to select the first row address from the first plurality of row addresses.

Example 12: The memory controller of example 11, wherein a first row addressed by the first row address is physically adjacent to a second row addressed by the second row address.

Example 13: The memory controller of example 11, wherein the memory device uses the randomized selection technique to select a third row address from a second plurality of row addresses received by the memory device between the second pair of consecutive refresh management commands.

Example 14: The memory controller of example 8, wherein the first pair of consecutive refresh management command and the second pair of consecutive refresh management commands are to have a common refresh management command.

Example 15: A method of operating a memory device, comprising: transmitting, to the memory device, a first number of row activate commands between a first pair of consecutive refresh management commands; and transmitting, to the memory device, a second number of row activate commands between a second pair of consecutive refresh management commands, wherein the first number and the second number are not equal.

Example 16: The method of example 15, further comprising: transmitting, to the memory device, a third number of row activate commands between a third pair of consecutive refresh management commands, wherein the third number is not equal to the first number and is not equal to the second number.

Example 17: The method of example 15, further comprising: receiving, from the memory device, an indicator of a selected number of row activate commands to be transmitted between pairs of consecutive refresh management commands.

Example 18: The method of example 17, wherein the selected number is not equal to the first number and is not equal to the second number.

Example 19: The method of example 18, wherein a sum of the first number and the second number is less than or equal to the selected number.

Example 20: The method of example 15, wherein the memory device, in response to receiving a refresh management command, refreshes a first row that is physically adjacent to a second row, where the address of the second row was received between the first pair of refresh management commands.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory controller, comprising:
an external command interface to transmit row activate (ACT) commands and refresh management (RFM) commands to an external memory device; and,
control circuitry to determine a first number of row activate commands to be transmitted between a first refresh management command and a second refresh management command, and to determine a second number of row activate commands to be transmitted between the second refresh management command and a third refresh management command, the first number and the second number to be unequal, the first, second, and third refresh management commands to respectively cause a refresh of rows physically adjacent to respective selected rows of the external memory device, wherein the first number and the second number are positive integers.

2. The memory controller of claim 1, wherein the memory controller receives, from the external memory device, a first indicator associated with a third number of row activate commands.

3. The memory controller of claim 2, wherein the first number is greater than the third number and the second number is less than the third number.

4. The memory controller of claim 2, wherein an average of the first number and the second number is not equal to the third number.

5. The memory controller of claim 2, wherein the memory controller selects a first row address from a first plurality of row addresses transmitted in association with a first plurality of row activate commands transmitted to the external memory device between the first refresh management command and the second refresh management command and, transmits the second refresh management command to the external memory device in association with the first row address.

6. The memory controller of claim 5, wherein the memory controller selects a third row address from a second plurality of row addresses transmitted in association with a second plurality of row activate commands transmitted to the external memory device between the second refresh management command and the third refresh management command and, transmits the third refresh management command to the external memory device in association with the second row address.

7. The memory controller of claim 5, wherein a first row addressed by the first row address is physically adjacent to a second row addressed by the second row address.

8. A memory controller, comprising:
an external command interface to transmit, to an external memory device, a first number of row activate (ACT) commands between a first pair of consecutive refresh management commands, and to transmit a second number of row activate commands between a second pair of consecutive refresh management commands, wherein refresh management commands are to respectively cause a refresh of rows physically adjacent to respective selected rows of the external memory device; and
wherein the first number and the second number are not equal, and wherein the first number and the second number are positive integers.

9. The memory controller of claim 8, wherein the external command interface is to also transmit a third number of row activate commands between a third pair of consecutive refresh management commands, the third number is not equal to the first number and is not equal to the second number, and the third number is a positive integer.

10. The memory controller of claim 8, wherein the external memory device selects is to select a first row address from a first plurality of row addresses transmitted by the external command interface to the external memory device between the first pair of consecutive refresh management commands and, in response to a first refresh management command and based on the first row address, the external memory device selects at least a second row address to be refreshed.

11. The memory controller of claim 10, wherein the external memory device uses a randomized selection technique to select the first row address from the first plurality of row addresses.

12. The memory controller of claim 11, wherein a first row addressed by the first row address is physically adjacent to a second row addressed by the second row address.

13. The memory controller of claim 11, wherein the external memory device uses the randomized selection technique to select a third row address from a second plurality of row addresses transmitted by the external command interface to the external memory device between the second pair of consecutive refresh management commands.

14. The memory controller of claim 8, wherein the first pair of consecutive refresh management commands and the second pair of consecutive refresh management commands are to have a common refresh management command.

15. A method of operating a memory device, comprising:
transmitting, to an external command interface of the memory device, a first number of row activate commands between a first pair of consecutive refresh management commands; and
transmitting, to the external command interface of the memory device, a second number of row activate commands between a second pair of consecutive refresh management commands, wherein the first number and the second number are not equal, the first number and the second number are positive integers, and the consecutive refresh management commands are to respectively cause a refresh of rows physically adjacent to respective selected rows of the memory device.

16. The method of claim 15, further comprising:
transmitting, to the external command interface of the memory device, a third number of row activate commands between a third pair of consecutive refresh management commands, wherein the third number is a positive integer, is not equal to the first number, and is not equal to the second number.

17. The method of claim 15, further comprising:
receiving, from the memory device, an indicator of a selected number of row activate commands to be transmitted to the external command interface of the memory device between pairs of consecutive refresh management commands.

18. The method of claim 17, wherein the selected number is not equal to the first number and is not equal to the second number.

19. The method of claim 18, wherein a sum of the first number and the second number is less than or equal to the selected number.

20. The method of claim 15, wherein the memory device, in response to receiving a refresh management command, is to refresh a first row that is physically adjacent to a second row, where an address of the second row was transmitted, to the external command interface of the memory device, between the first pair of consecutive refresh management commands.

* * * * *